United States Patent
Miller et al.

(10) Patent No.: US 8,663,825 B2
(45) Date of Patent: Mar. 4, 2014

(54) END OF LIFE INDICATION SYSTEM AND METHOD FOR NON-AQUEOUS CELL HAVING AMORPHOUS OR SEMI-CRYSTALLINE COPPER MANGANESE OXIDE CATHODE MATERIAL

(75) Inventors: Greg Miller, Diamond, MO (US); William Studyvin, Cherokee, KS (US); Michael Parrot, Joplin, MO (US); John C. Pugsley, Galena, KS (US); Ernest Ndzebet, Joplin, MO (US); Min Qi Yang, Webb City, MO (US); Viet Vu, Carl Junction, MO (US); Umamaheswari Janakiraman, Webb City, MO (US); Jeremy Chi-Han Chang, Webb City, MO (US); Ramanathan Thillaiyan, Webb City, MO (US); Dong Zhang, Joplin, MO (US); Mario Destephen, Joplin, MO (US)

(73) Assignee: Eaglepicher Technologies, LLC, Joplin, MO (US)

( * ) Notice: Subject to any disclaimer, the term of this patent is extended or adjusted under 35 U.S.C. 154(b) by 788 days.

(21) Appl. No.: 12/718,743

(22) Filed: Mar. 5, 2010

(65) Prior Publication Data
US 2010/0310907 A1 Dec. 9, 2010

Related U.S. Application Data

(63) Continuation-in-part of application No. 12/614,667, filed on Nov. 9, 2009.

(60) Provisional application No. 61/157,827, filed on Mar. 5, 2009, provisional application No. 61/161,303, filed on Mar. 18, 2009, provisional application No. 61/161,300, filed on Mar. 18, 2009, provisional application No. 61/173,534, filed on Apr. 28, 2009.

(51) Int. Cl.
*H01M 10/48* (2006.01)
*H01M 4/48* (2010.01)

(52) U.S. Cl.
USPC .......... 429/90; 429/220; 429/224; 340/636.1

(58) Field of Classification Search
USPC ............... 429/90, 217–222; 29/623.1–623.5; 340/635, 636.1
See application file for complete search history.

(56) References Cited

U.S. PATENT DOCUMENTS

| 3,898,096 A | 8/1975 | Herédy et al. |
| 3,992,222 A | 11/1976 | Walsh et al. |

(Continued)

FOREIGN PATENT DOCUMENTS

| EP | 1 207 568 A2 | 5/2002 |
| EP | 1 295 851 A1 | 3/2003 |

(Continued)

OTHER PUBLICATIONS

International Search Report dated May 10, 2010 in International Patent Application No. PCT/US2010/026408.

(Continued)

*Primary Examiner* — Edu E Enin-Okut
(74) *Attorney, Agent, or Firm* — Oliff PLC

(57) ABSTRACT

The present disclosure relates generally to indicating an end of life condition of an electrochemical device, and more particularly to systems and methods for sensing and determining an end of life condition in a cell comprising a high capacity cathode material suitable for use in a non-aqueous electrochemical cell. The high capacity cathode material has an amorphous or semi-crystalline form of copper manganese oxide, and optionally fluorinated carbon. The present disclosure additionally relates to transmitting the determined end of life condition to a user or monitoring device of the cell.

22 Claims, 22 Drawing Sheets

(56) References Cited

U.S. PATENT DOCUMENTS

| | | | |
|---|---|---|---|
| 4,259,415 A | 3/1981 | Tamura et al. | |
| 4,608,324 A | 8/1986 | Fujii et al. | |
| 4,728,590 A | 3/1988 | Redey | |
| 4,954,403 A | 9/1990 | Plichta et al. | |
| 5,180,642 A | 1/1993 | Weiss et al. | |
| H1335 H | 7/1994 | Plichta et al. | |
| 5,534,367 A | 7/1996 | Kaun | |
| 5,667,916 A * | 9/1997 | Ebel et al. | 429/219 |
| 5,696,437 A | 12/1997 | Panther et al. | |
| 5,736,275 A | 4/1998 | Kaun | |
| 6,465,129 B1 * | 10/2002 | Xu et al. | 429/224 |
| 6,580,908 B1 | 6/2003 | Kroll et al. | |
| 6,584,355 B2 * | 6/2003 | Stessman | 607/29 |
| 6,936,379 B2 | 8/2005 | Gan et al. | |
| 7,476,467 B2 | 1/2009 | Park et al. | |
| 2003/0082452 A1 | 5/2003 | Ueda et al. | |
| 2003/0088378 A1 | 5/2003 | Freitag | |
| 2003/0104269 A1 * | 6/2003 | Gan et al. | 429/128 |
| 2003/0228520 A1 | 12/2003 | Kaun | |
| 2005/0003269 A1 | 1/2005 | Nanjundaswamy et al. | |
| 2005/0048370 A1 | 3/2005 | Guidotti et al. | |
| 2005/0102005 A1 * | 5/2005 | Krig et al. | 607/29 |
| 2005/0135993 A1 * | 6/2005 | Xu et al. | 423/605 |
| 2005/0227146 A1 | 10/2005 | Ghantous et al. | |
| 2007/0077488 A1 | 4/2007 | Chen et al. | |
| 2007/0099080 A1 | 5/2007 | Pickett et al. | |
| 2007/0250126 A1 * | 10/2007 | Maile et al. | 607/16 |
| 2007/0281213 A1 | 12/2007 | Pyszczek | |
| 2007/0292748 A1 | 12/2007 | Dekel et al. | |
| 2008/0090138 A1 | 4/2008 | Vu et al. | |
| 2008/0182170 A1 | 7/2008 | Rong et al. | |
| 2008/0294447 A1 | 11/2008 | Steiner | |
| 2010/0310917 A1 | 12/2010 | Swift et al. | |

FOREIGN PATENT DOCUMENTS

| | | |
|---|---|---|
| JP | A-61-135056 | 6/1986 |
| JP | A-2-61962 | 3/1990 |
| JP | A-2-267861 | 11/1990 |
| JP | A-09-127216 | 5/1997 |
| JP | A-2003-243046 | 8/2003 |
| JP | A-2004-207210 | 7/2004 |
| JP | A-2008-293997 | 12/2008 |
| WO | WO 2005/060026 A2 | 6/2005 |
| WO | WO 2009/014845 A2 | 1/2009 |

OTHER PUBLICATIONS

Written Opinion of the International Searching Authority dated May 10, 2010 in International Patent Application No. PCT/US2010/026408.

Related International Search Report dated Jan. 28, 2010 in International Patent Application No. PCT/US2009/063716.

Related Written Opinion of the International Searching Authority dated Jan. 28, 2010 in International Patent Application No. PCT/US2009/063716.

Related International Search Report dated May 25, 2010 in International Patent Application No. PCT/US2010/029984.

Related Written Opinion of the International Searching Authority dated May 25, 2010 in International Patent Application No. PCT/US2010/029984.

Related in International Search Report dated Jun. 1, 2010 in International Patent Application No. PCT/US2010/029980.

Related Written Opinion of the International Searching Authority dated Jun. 1, 2010 in International Patent Application PCT/US2010/029980.

Related in International Search Report dated Jul. 27, 2010 in International Patent Application No. PCT/US2010/027612.

Related in Written Opinion of the International Searching Authority dated Jul. 27, 2010 in International Patent Application No. PCT/US2010/027612.

Sep. 20, 2011 International Preliminary Report on Patentability issued in Application No. PCT/US2010/027612.

Hiroi et al., "Effective conductivities of FeS positives in LiCl—LiBr—LiF electrolyte at different states of charge", Journal of Applied Electrochemistry 16 (1986), pp. 309-311.

Masset et al., "Retained molten salt electrolytes in thermal batteries", J. of Power Sources 139 (Available online Sep. 8, 2004), pp. 356-365.

Oct. 24, 2011 European Search Report issued in European Patent Application No. 11171301.2-2119.

U.S. Appl. No. 12/754,405, filed Apr. 5, 2010 in the name of Swift et al.

U.S. Appl. No. 12/614,667, filed Nov. 9, 2009 in the name of Chang et al.

U.S. Appl. No. 13/161,614, filed Jun. 16, 2011 in the name of Swift et al.

U.S. Appl. No. 12/754,417, filed Apr. 5, 2010 in the name of Swift et al.

U.S. Appl. No. 12/725,872, filed Mar. 17, 2010 in the name of Zhang et al.

U.S. Appl. No. 61/112,562, filed Nov. 7, 2008 in the name of Chang et al.

Nov. 13, 2012 Office Action issued in U.S. Appl. No. 12/754,417.

Oct. 16, 2012 Office Action issued in European Patent Application No. 09 752 072.0.

Jan. 10, 2013 Office Action issued in U.S. Appl. No. 12/725,872.

Aug. 29, 2012 Office Action issued in U.S. Appl. No. 12/754,405.

Sep. 14, 2012 Office Action issued in U.S. Appl. No. 12/614,667.

Sep. 24, 2012 Office Action issued in U.S. Appl. No. 12/725,872.

Mar. 7, 2013 Office Action issued in U.S. Appl. No. 13/161,614.

Apr. 11, 2013 Office Action issued in U.S. Appl. No. 12/614,667.

Apr. 17, 2013 Office Action issued in U.S. Appl. No. 12/725,872.

Sep. 24, 2013 Notification of Reasons for Refusal issued in Japanese Application No. 2011-553144 with English-language translation.

* cited by examiner

FIG. 8

| Batch ID | Temperature (°C) | Time (hours) | Sample Average Density (g/cm$^3$) |
|---|---|---|---|
| S080811-1 | 400 | 1 | 4.6305 |
| S080811-2 | 400 | 2 | 4.6970 |
| S080814-1 | 400 | 4 | 4.8184 |
| S080812-1 | 250 | 2 | 4.0231 |
| S080813-1 | 250 | 8 | 4.2330 |
| S080813-2* | 250 | 24 | 4.4180 |
| S080814-2 | 100 | 24 | 4.0064 |
| S080808 | 100 | 30 days | 4.0968 |

FIG. 12A
FIG. 12B
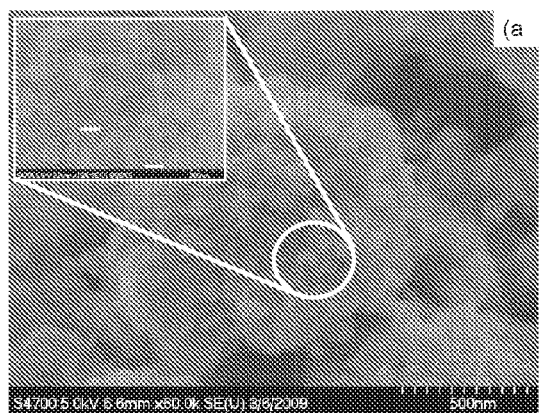
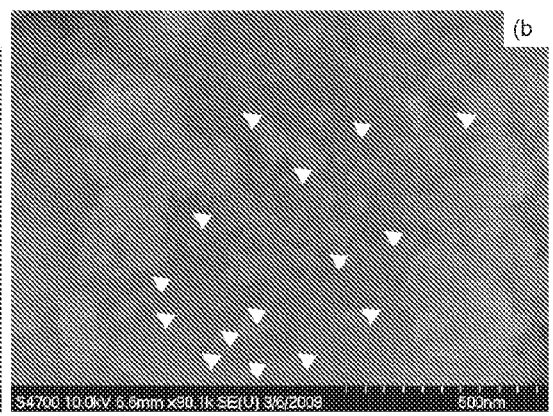

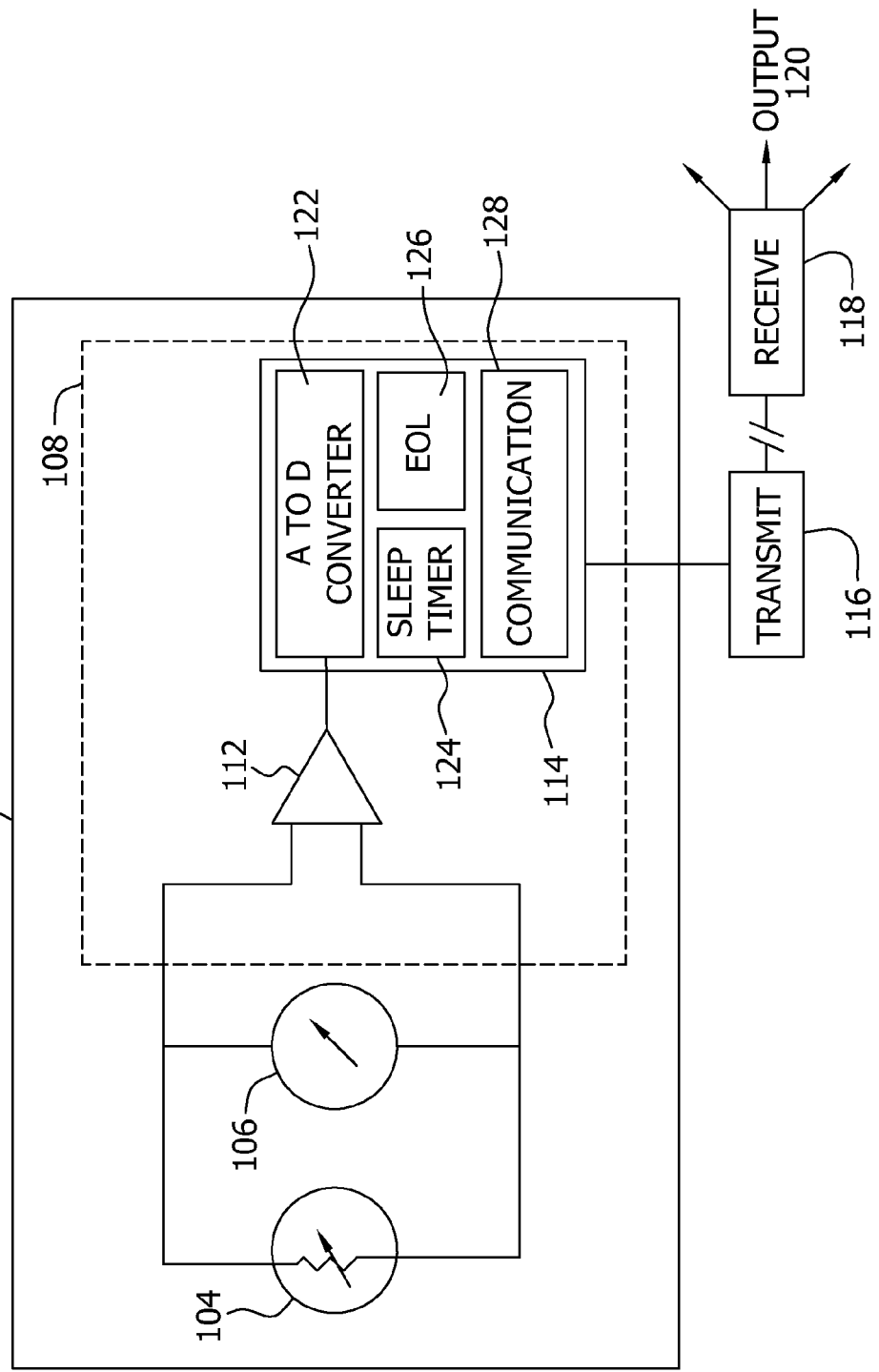

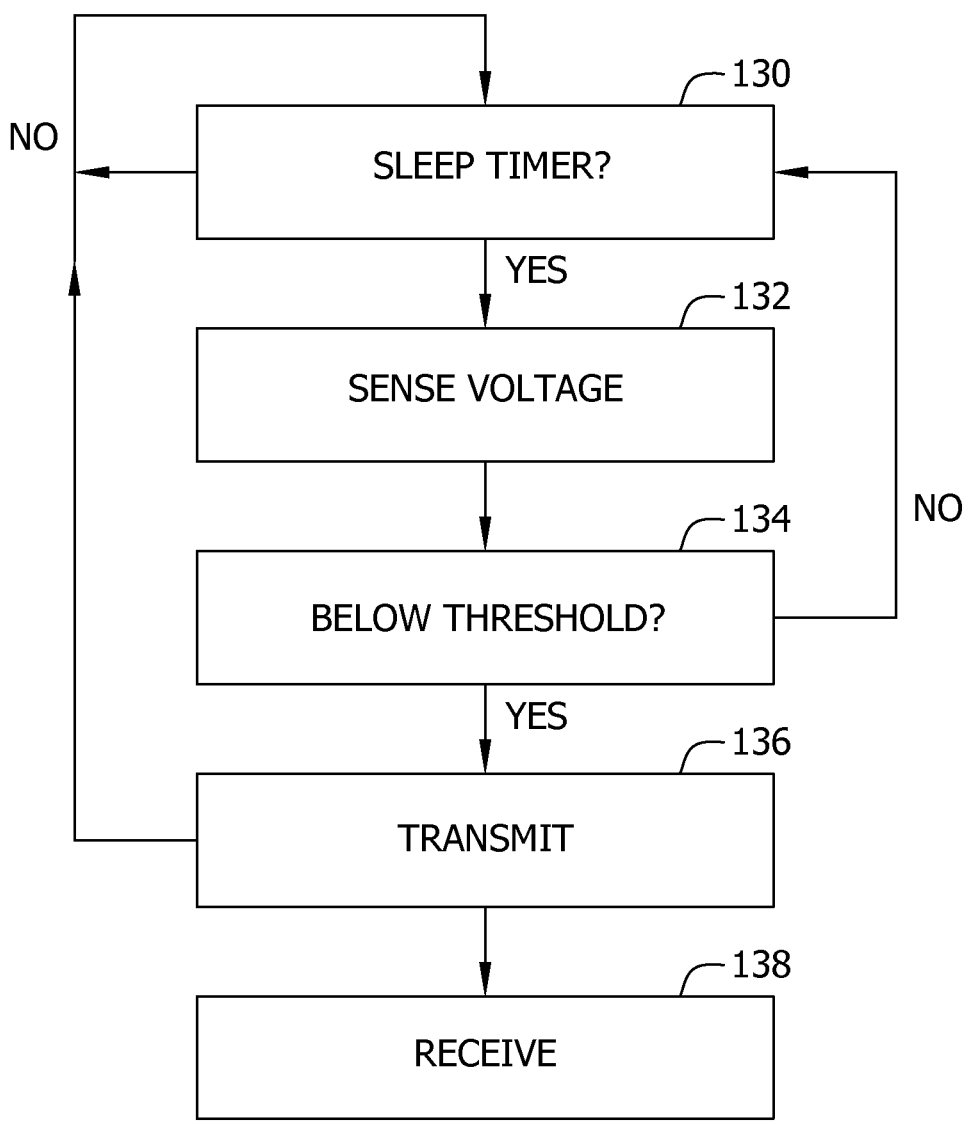

END OF LIFE INDICATION SYSTEM AND METHOD FOR NON-AQUEOUS CELL HAVING AMORPHOUS OR SEMI-CRYSTALLINE COPPER MANGANESE OXIDE CATHODE MATERIAL

CROSS-REFERENCE TO RELATED APPLICATIONS

This application claims priority from U.S. patent application Ser. No. 12/614,667 (filed Nov. 9, 2009), U.S. Provisional Patent Application No. 61/157,827 (filed Mar. 5, 2009), U.S. Provisional Patent Application No. 61/161,303 (filed Mar. 18, 2009), U.S. Provisional Patent Application No. 61/161,300 (filed Mar. 18, 2009), and U.S. Provisional Patent Application No. 61/173,534 (filed Apr. 28, 2009), the entire contents of each being incorporated herein by reference.

FIELD

The present disclosure relates generally to indicating an end of life condition of an electrochemical device, and more particularly to systems and methods for sensing and determining an end of life condition in a cell comprising a high capacity cathode material suitable for use in a non-aqueous electrochemical cell. The high capacity cathode material comprises an amorphous or semi-crystalline form of copper manganese oxide, and optionally fluorinated carbon. The present disclosure additionally relates to transmitting the determined end of life condition to a user of the cell.

BACKGROUND

Products powered by electrochemical devices are limited by the useful life of the electrochemical device (i.e., the ability of the electrochemical device to supply energy to the application). For example, the useful life of a flashlight is limited by the ability of a cell to provide sufficient current to the flashlight lamp or light-emitting diode. This useful life is dependent on several factors not controlled by the user such as rate of discharge, age of the electrochemical device, and environment where the device is used. The time at which an electrochemical device reaches the end of its useful life may be termed the "End of Life" (EOL) of the device.

In applications powered by electrochemical devices comprising a primary cell, knowledge of an EOL condition of the cell may alert the user that it is time to replace the cell. In applications powered by electrochemical devices comprising a secondary cell, the EOL condition may signal to the user that it is time to charge the cell. For example, if a flashlight user is made aware that the EOL condition of the cell is approaching, the cell may be replaced or charged when the flashlight is not in use so that the flashlight may provide light during all times of use.

Lithium electrochemical cells, which are more commonly referred to as batteries, are widely used in a variety of military and consumer products. Many of these products utilize high energy and high power batteries. Due in part to the miniaturization of portable electronic devices, it is desirable to develop even smaller lithium batteries with an increased power capability and service life. One way to develop smaller batteries with increased service life is to develop higher energy cathode materials.

One example of a high energy cathode material is fluorinated carbon (i.e., $CF_x$). $CF_x$ is often used with a lithium anode in non-rechargeable (primary) batteries for, among other things, military devices and implantable medical devices. $CF_x$ (where x=1.0) has a specific energy of about 860 mAh/g. Other examples of high energy cathode materials include silver vanadium oxide and manganese dioxide, which have specific capacities of about 315 and 308 mAh/g, respectively.

The cathodes for rechargeable (secondary) batteries, such as Li ion batteries, generally have lower energy storage capability than primary battery cathodes. However, secondary batteries can typically be recharged several hundred times, which significantly reduces the lifetime cost as well as the battery disposal costs. Examples of secondary battery cathodes used in Li ion batteries include lithium cobalt oxide, lithium iron phosphate, and lithium nickel cobalt oxide.

To satisfy the demands for longer lasting or smaller batteries, there continues to be a need to develop cathodes exhibiting higher energy like primary batteries with the possibility of partial or fully rechargeable capability like secondary batteries, thus extending lifetime and effectively reducing the overall cost. Mixed cathode materials have been proposed as one possible approach for achieving such improved primary and/or secondary batteries. Other benefits of mixed cathode materials include enhancing the rate capability and/or stability of the cathode, while maintaining the energy density per weight and/or per volume. Approaches for achieving such benefits have typically involved mixing a high rate-capable cathode material with a high energy-density cathode material.

U.S. Pat. No. 7,476,467 discloses a cathode material for secondary lithium batteries. The cathode active material comprises a mixture of (A) a lithium manganese-metal composite oxide having a spinel structure, and (B) a lithium nickel-manganese-cobalt composite oxide having a layered structure. The cathode active material is said to have superior safety and a long-term service life at both room temperature and high temperature due to improved properties of lithium and the metal oxide.

During discharge, some cells (e.g., $CF_x$ based cells) exhibit an interval where the discharge voltage of the cell remains relatively constant. Near the EOL of the cell, the discharge voltage decreases rapidly with respect to discharge capacity and/or time. That is, a voltage discharge curve that is a plot of discharge voltage versus specific capacity or time displays a large negative slope. A decrease in voltage below the relatively constant discharge voltage may not provide useful information about the EOL condition because of the coinciding rapid drop in discharge voltage. In other words, very little time exists between the beginning of the sharp voltage drop and the actual EOL of the cell. Additionally, the slope of the voltage discharge curve varies from cell to cell because of variances that exist and/or are inherent in cell materials and cell manufacturing processes. The large negative slope of the voltage discharge curve and its variability from cell to cell affects the accuracy, repeatability, and utility of using voltage measurements at the terminals of the electrochemical device to determine the EOL condition of a cell.

In critical applications or applications where the cell is not readily accessible (i.e., the cell may not be easily replaced), information regarding the EOL condition may be transmitted to a user of a device, or to another party. Examples of these types of applications are implantable medical devices, devices used for remote sensing of earthquakes, volcanoes, tsunamis, or other environmental conditions, or devices for military/law enforcement communications during training and combat missions. In each of these examples, the cell may not be readily accessible, and failure to perform required functions due to a low battery condition may not be an acceptable outcome.

It is known to those skilled in the art that composite cathodes comprising fluorinated carbon with some other metal oxide are used for the purpose of providing the battery with an end-of-life (EOL) indicator (i.e., providing a short interval of useful discharge voltage after the interval of relatively constant discharge voltage). For example, U.S. Pat. No. 5,667,916 describes a battery having a cathode mixture of $CF_x$ and other materials, including for example copper oxide, the other material or mixtures of other materials serving as the end-of-life indicator. Similarly, U.S. Pat. No. 5,180,642 discloses electrochemical cells or batteries having a cathode mixture comprised of manganese dioxide ($MnO_2$), carbon monofluoride ($CF_x$, where x=1), or mixtures of the two, and an end-of-life additive selected from the group consisting of vanadium oxide, silver vanadate, bismuth fluoride and titanium sulfide. U.S. Pat. No. 4,259,415 provides a cathode material as an end-of-life indicator comprising a main positive active material and a precursor. Suitable main positive active materials include molybdenum oxide ($MoO_3$), silver oxide ($Ag_2O$), and graphite fluoride $(CF)_n$.

Although many batteries or cells developed to-date include end-of-life indicators, the energy density is less than desired. The capacity (e.g. mAh/gm or mAh/cc) of the EOL additive to $CF_x$ (for example, silver vanadium oxide, or SVO) is lower than that of the $CF_x$ material, resulting in a composite electrode with a total capacity lower than that of the $CF_x$ by itself. Additionally, or alternatively, many electrochemical devices, batteries, or cells developed to-date exhibit an initial voltage sag or drop at the beginning of the discharge. Therefore, a need continues to exist for improved cells, and more particularly for improved cathode materials for use in such cells, detection of an EOL condition in such cells, and transmission of the EOL condition to a user of the cell.

SUMMARY

Briefly, therefore, the present disclosure is directed to detecting an end of life condition in a non-aqueous electrochemical cell and providing an indication of the end of life condition. The cell comprises: (i) an anode; (ii) a cathode comprising a cathode material comprising copper manganese oxide; (iii) a separator disposed between the anode and the cathode; and, (iv) a non-aqueous electrolyte which is in fluid communication with the anode, the cathode and the separator.

The present disclosure is further directed to a system and method for selectively providing an indication of an end of life condition. The system includes an electrochemical device, a sense component, and a controller. The electrochemical device comprises a positive terminal, a negative terminal, and a cell. A cathode of the cell includes amorphous or semi-crystalline copper manganese oxide cathode material. The sense component includes a positive input connected to the positive terminal of electrochemical device, a negative input connected to the negative terminal of the electrochemical device, and a voltage sensor for sensing a voltage of the electrochemical device. The controller is connected to an output of the sense component and receives a signal indicative of the voltage of the electrochemical device. The controller determines whether to provide an indication of an end of life condition as a function of the received signal, and selectively provides an indication of the end of life condition as a function of the determining.

The present disclosure is also directed to an electronic device comprising a load, an electrochemical device, and an end of life sensor, and a method of selectively providing an indication of an end of life condition of the electrochemical device. The electrochemical device has a positive terminal connected to a positive terminal of the load, a negative terminal connected to a negative terminal of the load, and a cell having a cathode comprising an amorphous or semi-crystalline copper manganese oxide cathode material. The electrochemical device provides electrical power to the load. The end of life sensor includes a sense component and a controller. The sense component includes a positive input connected to the positive terminal of electrochemical device, a negative input connected to the negative terminal of the electrochemical device, and a voltage sensor for sensing a voltage of the electrochemical device. The controller is connected to an output of the sense component and receives a signal indicative of the voltage of the electrochemical device. The controller determines whether to provide an indication of an end of life condition as a function of the received signal, and selectively provides an indication of the end of life condition as a function of the determining.

It is to be noted that one or more of the additional features detailed below may be incorporated into one or more of the above-noted embodiments, without departing from the scope of the present disclosure.

BRIEF DESCRIPTION OF THE FIGURES

FIG. 8 is a table showing the density of various $Cu_a Mn_b O_c$ samples, the density being a function of the annealing temperature, according to various embodiments of the disclosure.

FIGS. 12A and 12B illustrate Scanning Electron Microscopic images of cathode material formed in accordance with various embodiments of the present disclosure.

FIG. 21 illustrates a block diagram of a device according to various embodiments that include various functional elements within a controller.

FIG. 22 illustrates a flow diagram of a method for sensing and transmitting an EOL condition of a cell.

DETAILED DESCRIPTION OF THE DISCLOSURE

Figure 1:
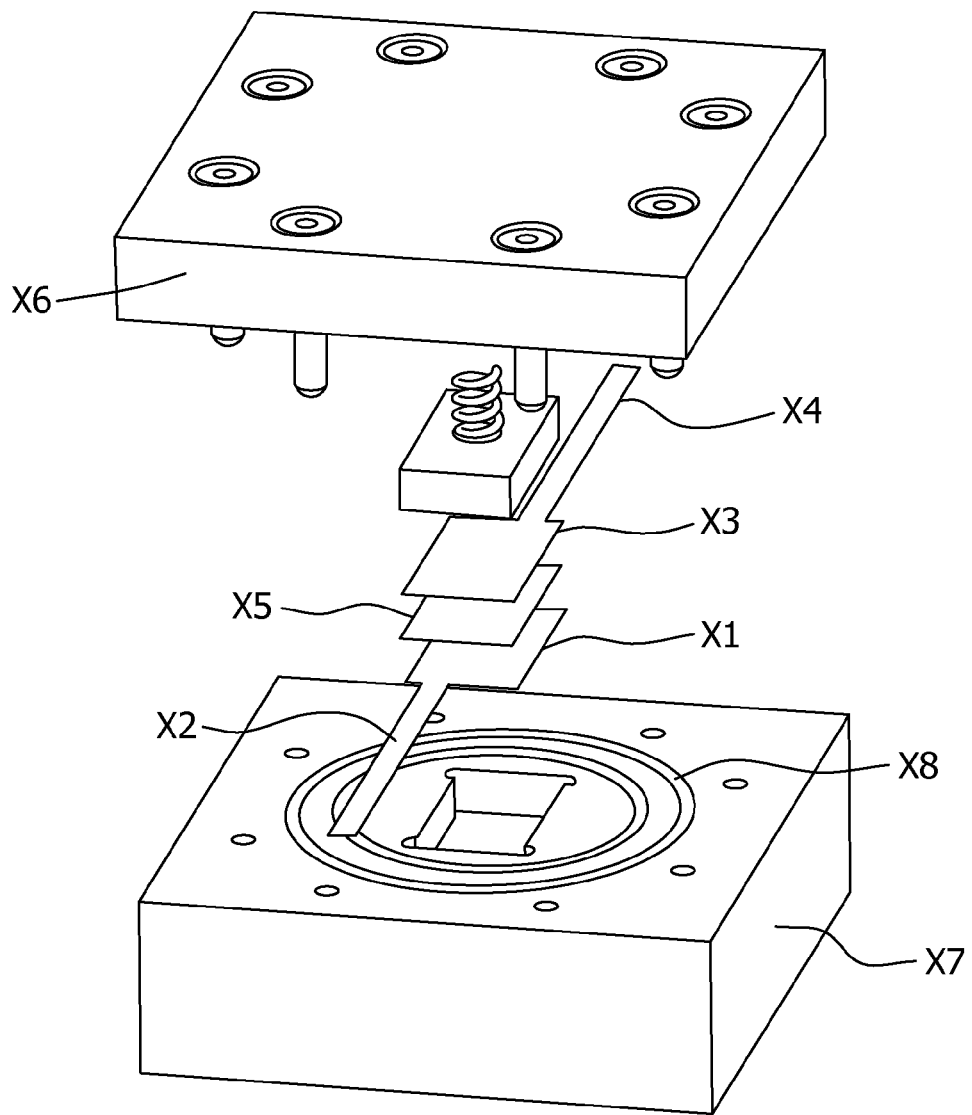
FIG. 1 illustrates a first exemplary test cell for testing various embodiments of the present disclosure.

1. Cathode Material Composition and Cell Components

In accordance with the present disclosure, and as further detailed herein below, it has been discovered that one or more performance properties of a non-aqueous electrochemical cell may be improved or enhanced by the use of a cathode material comprising copper manganese oxide, and more particularly amorphous or semi-crystalline copper manganese oxide. In one particular embodiment of the present disclosure, it has been further discovered that performance of such a non-aqueous cell may be improved or enhanced when copper manganese oxide, and more particularly amorphous or semi-crystalline, is used in combination with fluorinated carbon (i.e., $CF_x$).

In this regard it is to be noted that, as used herein, "non-aqueous" refers to an electrochemical cell that comprises or utilizes an organic solvent, or a mixture of organic solvents, in combination with an inorganic or organic salt, as an electrolyte. Accordingly, the non-aqueous electrolyte contains no added water; that is, water was not added to the electrolyte as a separate or distinct component thereof, but nevertheless may be present as a trace or underlying component or contaminant of the organic solvent(s) used to prepare it. For example, in one or more non-limiting embodiments of the present disclosure, the electrolyte may typically have a water content of less than about 1000 ppm, about 750 ppm, about 500 ppm, about 250 ppm, about 100 ppm, about 50 ppm, about 25 ppm, about 20 ppm, or even less.

In this regard it is to be further noted that an electrochemical cell may otherwise be referred to herein as a battery, a capacitor, a cell, an electrochemical device, or the like. It should be understood that these references are not limiting, and any cell that involves electron transfer between an electrode and an electrolyte is contemplated to be within the scope of the present disclosure.

In this regard it is to be still further noted that "improved" or "enhanced" performance properties generally refers to an improvement or enhancement in the specific energy, the energy density, the operating voltage, the rate capability, and/or the end-of-life behavior or indicator of the non-aqueous electrochemical cell of the present disclosure, as compared for example to a non-aqueous electrochemical cell that is similarly prepared or design but that lacks the copper manganese oxide cathode material as detailed herein.

The copper manganese oxide cathode material of the present disclosure may generally be represented by the formula $Cu_aMn_bO_c$, and in one or more particular embodiments may be represented by the formula $Cu_aMn_bO_c \cdot nH_2O$, wherein "$nH_2O$" represents the structural and/or surface water present in the cathode material. In the cathode material, copper may have an oxidation state between about +1 and about +3, and manganese may have an oxidation state between about +2 and about +7. Additionally, a, b and c each independently have a value of greater than 0, and furthermore (i) the sum of a+b may be in the range of from about 1 to about 3, while (ii) c has a value that may be experimentally determined and that is consistent with the values of a, b and the oxidation states of copper and manganese, and in one or more embodiments is a value such that copper has an oxidation state of approximately +2 or higher.

In this regard it is to be noted that the copper manganese oxide of the present disclosure is not crystalline (e.g., it does not have a spinel-type structure, as is generally known in the art). Rather, the copper manganese oxide of the present disclosure is amorphous, or alternative semi-crystalline, in form. The amorphous or semi-crystalline nature of the material is believed to be, at least in part, a function of the molar ratio of copper to manganese. In particular, among the various embodiments of the present disclosure are those wherein the amorphous copper manganese oxide has the formula $Cu_aMn_bO_c$, wherein the average molar ratio of Cu to Mn is about 1:1 or more, the ratio for example being between about 1:1 and less than (about) 3:1 (Cu:Mn), or between about 1.25:1 and less than about 2.75:1 (Cu:Mn), or between about 1.5:1 and less than about 2.5:1 (Cu:Mn). In various alternative embodiments, wherein the copper manganese oxide is semi-crystalline and has the formula $Cu_aMn_bO_c$, the average molar ratio of Cu to Mn is (about) 3:1 or more, the ratio for example being between (about) 3:1 and about 6:1 (Cu:Mn), or between about 3.25:1 and about 5.75:1 (Cu:Mn), or between about 3.5:1 and about 5.5:1 (Cu:Mn).

Additionally, it is to be noted that the amorphous or semi-crystalline copper manganese oxide cathode material of the present disclosure may advantageous having an average density of about 4 $g/cm^3$, about 4.5 $g/cm^3$, about 5 $g/cm^3$, about 5.5 $g/cm^3$, about 6 $g/cm^3$ or more (the density ranging for example from about 4 $g/cm^3$ to about 6 $g/cm^3$, or about 4.5 $g/cm^3$ to about 4.5 $g/cm^3$). Additionally, or alternatively, the cathode material may have a surface area (as determined using means generally known in the art, including for example the BET method) of at least about 50 $m^2/g$, of at least about 75 $m^2/g$, about 100 $m^2/g$, about 125 $m^2/g$, about 150 $m^2/g$, or more, and in one or more embodiments may have a BET surface within the range of, for example, about 50 to about 150 $m^2/g$, or about 75 to about 125 $m^2/g$. In this regard it is to be further noted that the surface area, and thus the ranges related thereto that are noted herein, is a function of the conditions under which the material was prepared, and therefore should not be viewed in a limiting sense.

In addition to the copper manganese oxide cathode material detailed herein, the other components of the non-aqueous electrochemical cell may be selected from among those generally known in the art. For example, according to various embodiments of the present disclosure, the cathode may also include a binder, for example, a polymeric binder such as polytetrafluoroethylene (PTFE) or polyvinylidene fluoride (PVDF), which may optionally be in powdered form. Additionally, carbon materials such as carbon black (e.g., Super P, from Timcal), natural and synthetic graphite, as well as their various derivatives (including graphene, graphite nano platelets, expanded graphite—such as KS4, from Timcal), carbon nano-fibers, and non-graphitic forms of carbon, such as coke, charcoal or activated carbon, may be used as conductive fillers in the cathodes.

In one particular embodiment, however, the cathode material of the present disclosure additionally comprises a carbonaceous active material, and includes graphitic material such as natural and synthetic graphite and all their derivatives including graphene, graphite nano-platelet, expanded graphite, carbon nano-fiber and nongraphitic forms of carbon such as coke, charcoal or activated carbon. In one preferred embodiment, the carbonaceous material is preferably prepared from carbon and fluorine (i.e., it is a fluorinated carbon material). The fluorinated carbon material may generally be represented by the formula $(CF_x)n$, wherein x typically varies between about 0.1 to 1.9, preferably between about 0.4 and 1.2, and more preferably between about 0.6 and 1.0. The fluorinated carbon can also be a mixture of $(CF_{x1})n$ and $(CF_{x2})m$, where x1 is preferably about 0.8 to 1.2, and x2 is preferably about 0.4 to 0.8. In this regard it is to be noted that in the formulas $(CF_x)n$ and $(CF_{x1})n$, as well as $(CF_{x2})m$, n and m refer to the number of monomer units which can vary widely, but may be for example within the range of about 1 to about 5. Accordingly, the ratio of $(CF_{x1})$ to $(CF_{x2})$ may be, for example, between about 5:1 and about 1:5, about 4:1 and about 1:4, or about 3:1 and about 1:3, or about 2:1 and about 1:2, or even a ratio of about 1:1; stated another way, the cathode material of the present disclosure, in various embodiments, may contain a mixture of $CF_x$, such as for example a mixture of $CF_1/CF_{0.6}$, wherein the mixture has contains for example about 90% $CF_1$ and about 10% $CF_{0.6}$, or about 80% $CF_1$ and about 20% $CF_{0.6}$, or about 75% $CF_1$ and about 25% $CF_{0.6}$, or about 67% $CF_1$ and about 33% $CF_{0.6}$, or about 50% $CF_1$ and about 50% $CF_{0.6}$, or vice versa.

It is to be noted that the precise composition of the copper manganese oxide, and/or the precise composition of the fluorinated carbon, and/or the respective concentrations of copper manganese oxide and/or fluorinated carbon, present in the cathode material may be optimized for a given application or use, by means generally known in the art. For example, in one particular embodiment, one or more of these factors may be controlled or optimized in order to improve or enhance the end-of-life behavior of the electrochemical cell. More specifically, one or more of these factors may be controlled or optimized in order to ensure that the electrochemical cell possess or exhibits a voltage plateau after some period of use or discharge, which may act as a useful end-of-life indicator. In this regard it is to be further noted that the discharge voltage of fluorinated carbon is typically between about 2.5 volt (V) and about 2.8V, depending on the discharge rate. In contrast, the copper manganese oxide material of present disclosure exhibits a voltage plateau between about 2 or about 2.3V and about 2.4V, as illustrated for example in FIG. 3.

As used herein, "voltage plateau" generally refers to a portion of the discharge curve that is substantially or relatively flat, within the noted voltage range, for some measurable or detectable period (e.g., over some measurable range of specific capacity values). This voltage plateau is well-suited as end-of-life indicator for a fluorinated carbon/copper manganese oxide non-aqueous electrochemical cell, in accordance with the present disclosure. The amount (i.e., concentration and/or ratio), composition, and/or form of the copper manganese oxide and fluorinated carbon can be optimized to give the desire end-of-life behavior for different applications (the concentrations or ratios of these two cathode materials, for example, having an effect on the specific capacity range at which or over which this plateau is observed).

The respective concentrations of copper manganese oxide and/or fluorinated carbon present in the cathode material may be optimized for a given application or use, by means generally known in the art. In one particular embodiment, however, the cathode mixture of the present disclosure may comprise from between about 1% and about 99%, by weight, of the fluorinated carbon, and in some instances may comprise from between about 10% and about 98%, or about 20% and about 97%, or about 40% and about 96%, or about 60% to about 95%, and in some embodiments may be between about 65% to about 90%, or about 70% to about 85%, by weight. Additionally, the cathode mixture may comprise from between about 1% and about 99%, by weight, of the copper manganese oxide, and in some instances may comprise from between about 2% and about 90%, or about 3% and about 80%, or about 4% and about 60%, or about 5% and about 40%, and in some embodiments may be between about 10% and about 35%, or about 15% and about 30%, by weight. In this regard it is to be noted that, in some embodiment, wherein the cathode material comprises copper manganese oxide and fluorinated carbon, the cathode material may consist essentially of these components; that is, the sum of the concentrations (or weight percents) of the copper manganese oxide and fluorinated carbon may be about 100%. However, in this regard it is to be noted that such concentrations should not be viewed in a limiting sense. For example, in various alternative embodiments, the copper manganese oxide may be the major component of the cathode material (rather than for example the fluorinated carbon).

It is also to be noted that, among the various embodiments of the present disclosure, are included those wherein the cathode material is non-lithiated. Stated another way, the cathode material is prepared such that, at least initially (i.e., prior to use), the cathode material is essentially free of lithium or lithium ions therein (i.e., lithium or lithium ions are not intentionally added as a component of the cathode material during preparation). In one particular embodiment, the cathode materials consists essentially of copper manganese oxide, fluorinated carbon, and optionally a binder material and/or a conductive additive (both as further detailed elsewhere herein below). For example, in one preferred embodiment, the cathode material comprises or consists essentially of, by weight, about 81% of the fluorinated carbon and about 12% of the copper manganese oxide, about 3% binder material, and about 4% conductive additive. However, such cathode materials may be utilized in an electrochemical cell with a lithium (Li) anode, for primary (non-rechargeable) or secondary (rechargeable) batteries. As a result, in use, lithium or lithium ions may be present in such a cathode material. The presence of such lithium or lithium ions in use should therefore not be viewed in a limiting sense.

Without being held to any particular theory, it is to be noted that the combination of copper manganese oxide and fluorinated carbon is believed to be particularly advantageous because the combination of these components yields a material having surprisingly higher capacity than expected, based on the individual capacities of the copper manganese oxide and fluorinated carbon. Stated another way, as further illustrated elsewhere herein, the capacity of this mixed cathode material has been observed to be higher than the sum of the individual capacities of the copper manganese oxide and fluorinated carbon alone.

The electrochemical cell of the present disclosure additionally comprises an anode, which may essentially comprise any anode material suitable for use in non-aqueous electrochemical cells. Typically, however, the anode comprises a metal selected from Group IA or Group IIA of the Periodic Table of the Elements, including for example lithium, magnesium, sodium, potassium, etc., and their alloys and intermetallic compounds, including for example Li—Mg, Li—Al, Li—Al—Mg, Li—Si, Li—B and Li—Si—B alloys and intermetallic compounds. The form of the anode may vary, but typically it is made as a thin foil of the anode metal, and a current collector having an extended tab or lead affixed to the anode foil.

As previously noted, the electrochemical cell of the present disclosure further includes a non-aqueous, ionically conductive electrolyte, which serves as a path for migration of ions between the anode and the cathode electrodes during the electrochemical reactions of the cell. The electrolyte can be in either liquid state or solid state, or both. The electrochemical reaction at the electrodes involves conversions of ions in atomic or molecular forms that migrate from the anode to the cathode. Thus, non-aqueous electrolytes suitable for the present disclosure are substantially chemically inert to the anode and cathode materials. Furthermore, a suitable electrolyte in liquid state exhibits those physical properties that are beneficial for ionic transport (e.g., low viscosity, low surface tension, and/or good wettability).

The various components of the electrolyte may be selected from among those generally known in the art, which are suitable for use in combination with the cathode materials detailed elsewhere herein. Preferably, however, a suitable electrolyte for use in accordance with the present disclosure has an inorganic or organic, ionically conductive salt dissolved in a non-aqueous solvent (or solvent system, when a mixture of solvents is used). More preferably, the electrolyte includes an ionizable alkali metal salt dissolved in an aprotic organic solvent or a mixture of solvents comprising a low viscosity solvent and a high permittivity solvent. Without being held to any particular theory, the inorganic, ionically conductive salt is believed to serve as the vehicle for migration of the anode ions to react with the cathode active material. Accordingly, preferably the ion-forming alkali metal salt is similar to the alkali metal comprising the anode.

In one particular embodiment of the present disclosure, for the electrolyte, the ionically conductive salt preferably has the general formula MM'F$_6$ or MM'F$_4$, wherein M is an alkali metal that is the same as at least one of the metals in the anode and M' is an element selected from the group consisting of phosphorus, arsenic, antimony and boron. Salts suitable for obtaining the formula M'F$_6$ include, for example, hexafluorophosphate (PF$_6$), hexafluoroarsenate (AsF$_6$) and hexafluoroantimonate (SbF$_6$), while salts suitable for obtaining the formula M'F$_4$ include, for example, tetrafluoroborate (BF$_4$). Alternatively, the corresponding sodium or potassium salts may be used. Thus, for a lithium anode, the alkali metal salt of the electrolyte may optionally be selected from, for example, LiPF$_6$, LiAsF$_6$, LiSbF$_6$ and LiBF$_4$, as well as mixtures thereof. Other salts that are useful with a lithium anode include, for example, LiClO$_4$, LiAlCl$_4$, LiGaCl$_4$, LiC(SO$_2$CF$_3$)$_3$, LiB(C$_6$H$_4$O$_2$)$_2$, LiN(CF$_3$SO$_2$)$_2$ and Li(CF$_3$SO$_3$), as well as mixtures thereof.

Low-viscosity solvents that may be suitable for use in accordance with the present disclosure in the electrochemical cell include, for example: dimethyl carbonate (DMC), diethyl carbonate, 1,2-dimethoxyethane (DME), tetrahydrofuran (THF), methyl acetate (MA), diglyme, triglyme, tetraglyme, and high permittivity solvents, include for example cyclic carbonates, cyclic esters and cyclic amides (such as propylene carbonate (PC), ethylene carbonate (EC), acetonitrile, dimethyl sulfoxide, dimethyl formamide, dimethyl acetamide, gamma-butyrolactone (GBL), and N-methyl-pyrrolidinone (NMP)), as well as various mixtures or combinations thereof.

The type and composition of the solvent used in the electrolyte, and/or the type and concentration of a salt present therein, may be selected in order to optimize one or more physical and/or performance properties of the electrochemical cell of the present disclosure. For example, in one or more embodiments of the present disclosure, the concentration of the salt in the electrolyte may be in the range of from about 0.5M to about 2.5M, or from about 0.75M to about 2.25M, or from about 1M to about 2M. In these or other embodiments of the present disclosure, wherein a mixed solvent system is employed, the ratio (volume) may range for example from between about 1:9 and about 9:1 of a first solvent (e.g., a carbonate solvent, such as propylene carbonate) and a second solvent (e.g., a substituted alkane solvent, such as 1,2-dimethoxyethane); that is, the solvent system may comprises from about 10 volume % to about 90 volume %, or from about 20 volume % to about 80 volume %, or from about 30 volume % to about 70 volume %, of a first solvent, all or substantially all of the balance of the solvent system being the second solvent. In one preferred embodiment, however, the anode is lithium metal and the preferred electrolyte is 1.0M to 1.8M LiBF$_4$ in a mixed PC/DME solvent system (the concentration of the solvent system being between about 10 volume % PC/90 volume % DME and about 70 volume % PC/90 volume % DME).

The electrochemical cell of the present disclosure additionally comprises a suitable separator material, which is selected to separate the cathode/cathode material from the Group IA or IIA anode/anode material, in order to prevent internal short circuit conditions. The separator is typically selected from materials known in the art to be electrically insulating (and sometimes ionically conductive), chemically non-reactive with the anode and cathode active materials, and both chemically non-reactive with and insoluble in the electrolyte. In addition, the separator material is selected such that it has a degree of porosity sufficient to allow flow through of the electrolyte during the electrochemical reaction of the cell. Finally, the separator material is typically selected to have a thickness ranging from, for example, about 15 microns to about 75 microns, or about 20 microns to about 40 microns.

Accordingly, suitable separator materials typically include, or may be selected from, porous or nonporous polymer membranes, such as for example: polypropylene, polyethylene, polyamide (e.g., nylon), polysulfone, polyvinyl chloride (PVC), and similar materials, and combinations thereof (e.g., a trilayer membrane, such as a trilayer membrane of polypropylene/polyethylene/polypropylene), as well as fabrics woven from fluoropolymeric fibers, including for example polyvinylidine fluoride (PVDF), polyvinylidine fluoride-cohydrofluorpropylene (PVDF-HFP), tetrafluoroethylene-ethylene copolymer (PETFE), chlorotrifluoroethylene-ethylene copolymer, and combinations thereof. Fabrics woven from these fluoropolymeric fibers can be used either alone or laminated a microporous film (e.g., a fluoropolymeric microporous film).

The form or configuration of the electrochemical cell of the present disclosure may generally be selected from those known in the art. In one particular embodiment, however, the form or configuration of the electrochemical cell is a case-negative design, wherein the cathode/anode/separator/electrolyte components are enclosed in a conductive metal casing such that the casing is connected to the anode current collector in a case-negative configuration, although case-neutral design is also suitable. A preferred material for the casing is titanium, although stainless steel, nickel, and aluminum are also suitable. The casing header comprises a metallic lid having a sufficient number of openings to accommodate the glass-to-metal seal/terminal pin feed through for the cathode electrode. The anode electrode is preferably connected to the case. An additional opening is provided for electrolyte filling. The casing header comprises elements having compatibility with the other components of the electrochemical cell and is resistant to corrosion. The cell is thereafter filled with the electrolyte solution described hereinabove and hermetically sealed, such as by welding a stainless steel plug over the fill hole. In this regard it is to be noted, however, that the cell of the present disclosure may alternatively be constructed in a case-positive design. Accordingly, the description provided herein should not be viewed in a limiting sense.

In this regard it is to be further noted that other components of the electrochemical cell (e.g., current collectors, etc.) may be selected from among those components generally known in the art, without departing from the scope of the present disclosure.

Once the cathode material has been prepared, it may be deposited on the cathode current collector in the form of single, substantially homogenous mixture (e.g., wherein copper manganese oxide particulate is dispersed into $CF_x$ particulate, or vice versa, depending on which is the major component and which is the minor component of the cathode material, and then this mixture is deposited in the form of a single layer on the cathode current collector). Alternatively, however, when a mixture of cathode components or materials are used, these materials may be deposited in the form of layers on (i) the same side of the current collector (e.g., a layer of copper manganese oxide deposited on the surface of the current collector, then a layer of $CF_x$ is deposited on the copper manganese oxide layer, or vice versa), or (ii) the opposite sides of the current collector.

It is to be noted that, unless otherwise stated, the various concentrations, concentration ranges, ratios, etc. recited herein, are provided for illustration purposes only and therefore should not be viewed in a limiting sense. It is to be additionally noted that all various combinations and permutations of compositions, concentrations, ratios, components, etc. are intended to be within the scope of and supported by the present disclosure.

2. Cathode Material Preparation

The copper manganese oxide cathode material may be prepared by means generally known in the art, involving for example the chemical reaction of various copper and manganese salts or oxides of both metals, either by solid state reactions or by wet chemistry (including, for example, thermal treatment, sol-gel formation, and hydrothermal synthesis in mixed states).

However, in one or more particular embodiments, the copper manganese oxide material may be prepared in a way that provides or yields the material in an amorphous or semi-crystalline form or state. For example, such copper manganese oxide material may be prepared by a co-precipitation process in the presence or absence of an oxidizing agent, such as potassium persulfate or potassium perchlorate, of copper salts and manganese salts, by a precipitating agent such as potassium hydroxide or sodium carbonate. Alternatively, the cathode material may be the product of the thermal decomposition of copper salts and manganese salts in an appropriate environment. By controlling, for example, the molar ratio of copper to manganese in the starting materials, such that the average molar ratio of copper to manganese in the copper manganese oxide reaction product is within the ranges detailed herein above, the copper manganese oxide reaction product may be amorphous or semi-crystalline, or a combination or mixture thereof.

Once prepared, the resulting copper manganese oxide may be obtained in the form of particulate (either directly, or after a milling or grinding step of some kind) having an average particle size ranging from about 10 nanometers to about 300 nanometers, or from about 50 nanometers to about 225 nanometers, or from about 80 nanometers to about 150 nanometers. Optionally, the particulate may be agglomerated to form larger particles, having for example an average particle size of ranging from about 5 microns to about 45 microns, or from about 7.5 microns to about 30 microns, or from about 10 microns to about 15 microns.

3. Electrochemical Cell Uses and Performance Properties

It is to be noted that the precise composition of the copper manganese oxide, and/or the cathode material (e.g., mixture of copper manganese oxide with $CF_x$), may be selected to optimize it for a desired performance property, and/or the desired end-use application of the electrochemical cell containing it. Additionally, it is to be noted that it is anticipated within the present disclosure that many other cathode materials may similarly benefit from the addition of $Cu_aMn_bO_c$, forming a hybrid cathode therewith. Accordingly, references to $CF_x$ should not be viewed in a limiting sense.

The cathode material of the present disclosure is generally suitable for use in essentially any non-aqueous electrochemical cell known in the art. Additionally, such an electrochemical cell of the present disclosure, which contains the noted cathode material, is generally suitable for a number of know applications or devices, including for example: medical devices (such as pace makers, defibrillators, cardiac monitors, drug delivery systems, pain management systems, etc.), portable military electronic devices (such as radios, transponders, weapon sights, etc.), marine devices (such as sonobuoys, torpedoes, etc.), aerospace devices (such as deep space probes, command destruct systems, back-up power systems, etc.), military and commercial sensors, remote data collection systems, among other known applications and devices. Such a cathode material, and more specifically the electrochemical cell containing it, may be particularly advantageous for use in devices requiring end-of-life indicators (e.g., medical devices) due to the voltage plateau the cell possess (as further illustrated elsewhere herein below) during the latter portion of the capacity.

In one particular embodiment, the non-aqueous electrochemical cell of the present disclosure may be configured as a reserve battery or cell, whereby the non-aqueous electrolyte is maintained separately from the electrodes, increasing the useful storage period of the battery over a wide temperature range. When needed, the non-aqueous electrolyte and electrodes may be automatically brought into contact, allowing the battery to function in a normal manner.

The cathode materials of the present disclosure, and the non-aqueous electrochemical cells comprising them, may additionally possess one or more other performance properties that are similar to, if not improved or enhanced as compared to, other materials and cells generally known in the art. For example, in various embodiments electrochemical cells or batteries that include a cathode comprising a $Cu_aMn_bO_c$ cathode material have been observed to exhibit a capacity that is substantially similar to, if not greater than, other high energy cathodes currently in use, such as $CF_x$. For example, in one or more embodiments of the present disclosure, the cathode material of the present disclosure may enable such a cell to produce more than about 800, about 900, about 1000, about 1100 milliamp-hours per gram (mAh/g) or greater capacity at room temperature. In comparison to the cathode material of the present disclosure, a cell comprising a $CF_x$ cathode material may provide about 820 mAh/g at room temperature. In other various embodiments, however, an electrochemical cell comprising the cathode material of the present disclosure may exhibit improved or enhanced specific energy, energy density, operating voltage, and/or rate capability, as compared for example to conventional non-aqueous electrochemical cells that use cathode materials that do not include copper manganese oxide as the cathode material.

Figure 10:
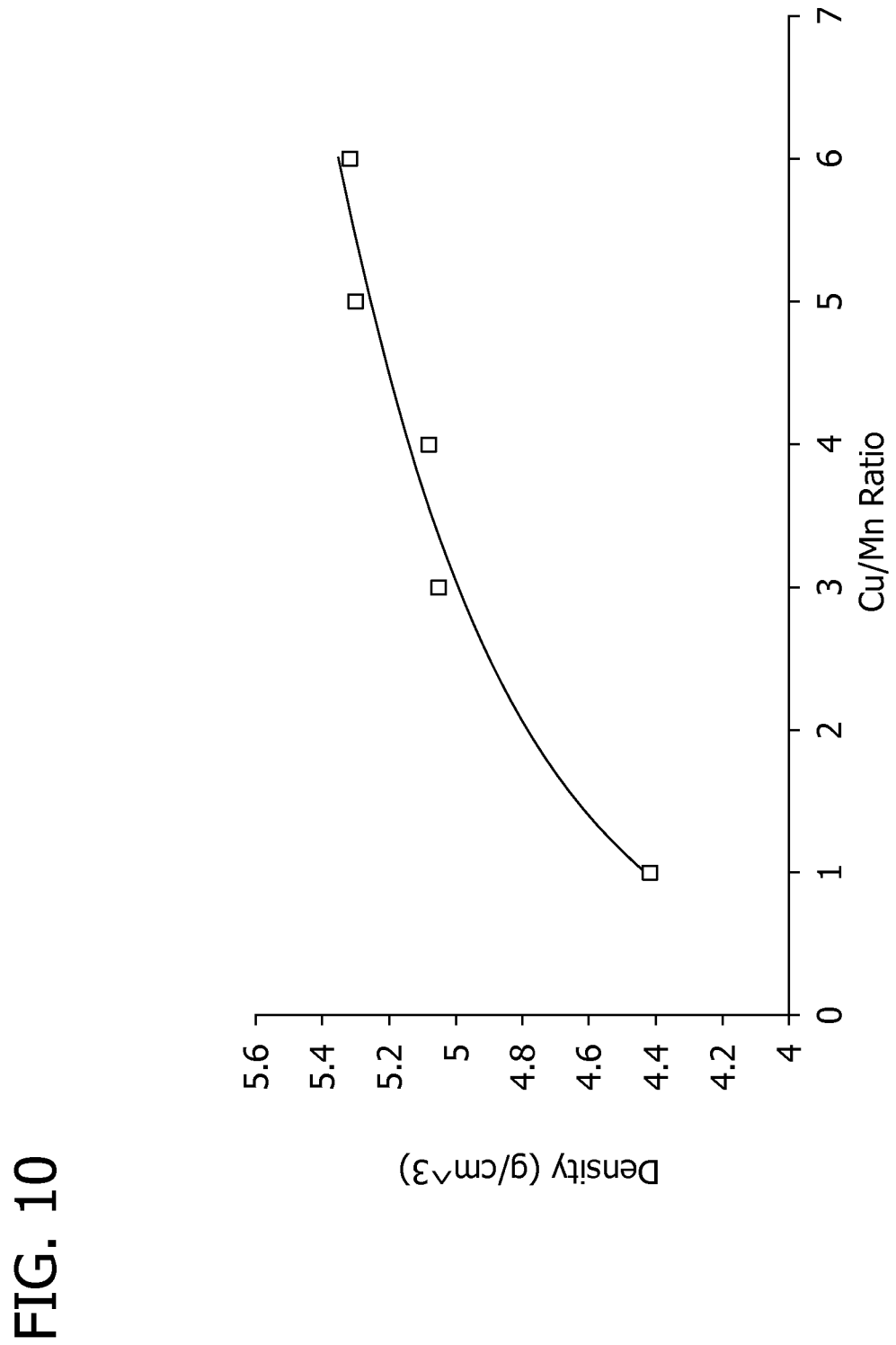
FIG. 10 illustrates the density of cathode materials formed in accordance with various embodiments of the present disclosure ($Cu_a Mn_b O_c$), and in particular illustrating the change in density as a function of Cu:Mn molar ratio.

Additionally, and as previously noted, $Cu_aMn_bO_c$ cathode material may also exhibit increased density compared to other high energy cathodes, and therefore provide a higher energy density than competing materials, such as $CF_x$. Exemplary densities of different materials are illustrated in FIGS. 8 and 10. However, it should be appreciated that the density may, in accordance with various aspects, vary depending on the process conditions by which the material was prepared (e.g., annealing temperature).

It is to be further noted that, in another particular embodiment of the present disclosure, the non-aqueous electrochemical cell may exhibit internal charging or rechargeability; that is, the $Cu_aMn_bO_c$ cathode material of the present disclosure may exhibit the ability to at least partial charge or recharge when used in the non-aqueous electrochemical cell of the present disclosure. Specifically, it has been observed that when electrochemical cells or batteries using such a cathode material, and specifically a cathode material comprising $Cu_aMn_bO_c$ and $CF_x$, were left at open circuit during a life-time test, which took several weeks, the cells exhibited an increasing open cell voltage over time. Furthermore, upon subsequent discharge, the total capacity of the cell exceeded theoretical expectations. Accordingly, the cathode material of the present disclosure exhibited an unexpected benefit, that being an internal recharge behavior without the use of an external power source of any kind.

The potential for at least partial internal charging or internal rechargeability, in addition to the very high primary energy, also makes electrochemical cells or batteries according to embodiments of the present disclosure uniquely-suited, for example, for use in a number of different types of devices. For example, such cells may be well-suited for use in implantable medical devices (e.g., pace makers). Alternatively, such cells may be used in devices designed for both for training and operational situations. An example is military or law enforcement radios that must be used for short periods of time in training, as well as long periods of operational or combat periods. Such devices generally utilize two different types of batteries: short life rechargeable batteries for training, and long life primary batteries for combat. $Cu_aMn_bO_c$ enhanced batteries may provide a benefit of combining both functions in a single unit, thereby enhancing performance, logistics, and cost savings.

In this regard it is to be noted that, as used herein, "internal charging" or "internal recharging", as well as variations thereof, generally refers to the ability of the $Cu_aMn_bO_c$ cathode material, when used in the non-aqueous electrochemical cell of the present disclosure, to recover or re-establish at least a portion of its initial capacity, without the application of an external energy source of some kind to do so.

Without being held to any particular theory, it is believed that the internal charging or recharging mechanism of an electrochemical cell or battery comprising a $Cu_aMn_bO_c/CF_x$ cathode material of the present disclosure may be described by the following set of reactions:

During Discharge of the Battery:
At the Anode:

$$Li \rightarrow Li^+ + e \quad (1)$$

At the Cathode ($Cu_aMn_bO_c/CF_x$/Other Oxides):

$$CF_x + xLi^+ + xe \rightarrow C + xLiF \quad (2)$$

$$CuO + 2Li^+ + 2e \rightarrow Li_2O + Cu \quad (3)$$

$$Cu_aMn_bO_c + nLi^+ + ne \rightarrow Li_nCu_aMn_bO_c \quad (4)$$

$$Mn_bO_c + mLi^+ + me \rightarrow Li_mMn_bO_c \quad (5)$$

Self-Charging or Internal Recharging at the Cathode:

$$2LiF + 2Cu \rightarrow CuF_2 + 2e + 2Li^+ \quad (6)$$

$$Mn_bO_c + me + mLi^+ \rightarrow Li_mMn_bO_c \quad (7).$$

The $CuF_2$ is an attractive cathode material, which can deliver a specific capacity of about 537 mAh/gm. $CuF_2$ may be electrochemically formed from LiF and Cu in a non-aqueous electrolyte, through an intermediate, as illustrated below:

$$4LiF + Cu \leftrightarrow Li_2CuF_2 + 2Li^+ + 2e \quad (8).$$

It is to be further noted that, in another particular embodiment of the present disclosure, the non-aqueous electrochemical cell may exhibit improved end-of-life behavior. More specifically, in one particular embodiment the composition (e.g., ratio of copper to manganese) and/or form of the copper manganese oxide (e.g., amorphous or semi-crystalline), and optionally the ratio or concentration thereof relative to the fluorinated carbon in the cathode material in the cell, enables the electrochemical cell to possess an improved end-of-life behavior, as compared to a similarly prepared cathode material in the absence of the copper manganese oxide, the cell for example exhibiting, during discharge, a distinct secondary voltage plateau (e.g., 152 of FIG. 4) that is less than a first distinct voltage plateau (e.g., 150 of FIG. 4), which is indicative of the approaching end-of-life of the cell. Exemplary end-of-life behavior is further illustrated in one or more Examples, below (see, e.g., FIGS. 3 and 4 and the discussion related thereto).

4. End of Life Detection and Indication of Electrochemical Cell

An electrochemical device may otherwise be referred to herein as a battery, a capacitor, a cell, an electrochemical cell, or the like. It should be understood that these references are not limiting, and any device that involves electron transfer between an electrode and an electrolyte is contemplated within the scope of the present disclosure.

Further, an electrochemical device may refer to single or multiple connected electrochemical devices, electrochemical cells, batteries or capacitors capable of supplying energy to a load, and none of the references herein to any particular device should be considered to limit the disclosure in any way.

Various embodiments may provide systems and methods for sensing and determining an EOL condition of a cell and providing or transmitting information related to the EOL condition. A priori information about an EOL condition of a cell (e.g., information known about the electrochemical behavior of the device based on device chemistry and other design variables) may allow for replacement or charging of the cell without a noticeable loss of function of an electronic device that is powered by the cell (i.e., the electrochemical device).

The remaining time until the EOL condition of a cell may be estimated from the capacity of the cell at the beginning of life and the discharge rate of the cell. The validity of the time estimation may depend on accurate determination of the beginning of life capacity of the cell and the environmental conditions surrounding the cell and/or in which the cell is expected to be used (e.g., temperature and humidity). Calculations may be quite complex for even minor load and/or environment changes.

For example, a given cell chemistry may exhibit a voltage discharge curve (i.e., discharge voltage plotted versus discharge capacity or time) that has two voltage plateaus: a first voltage plateau (see FIG. 4 at 150) that occurs during the useful life of the cell, and a second voltage plateau (see FIG. 4 at 152) that occurs near the EOL of the cell. By sensing this second voltage plateau, various embodiments of the present disclosure may facilitate recharging and/or replacing the cell before it reaches its EOL.

In accordance with various embodiments, use of information regarding an EOL condition may have two components. First, the EOL condition may be sensed in a manner that is accurate and repeatable under the environmental conditions and/or remote locations in which the cell operates. Second, the EOL condition may be transmitted or signaled to a user so that corrective action (cell charging or replacement) may occur. Transmission of EOL information relating to the cell may include visual, audible, wireless, digital, electronic, and/or analog communications with a monitoring device and/or user of the cell or electronic device powered by the cell. Any means for sensing and/or transmitting EOL information, whether now known or hereafter developed, is contemplated within the scope of the present disclosure.

Figure 19:
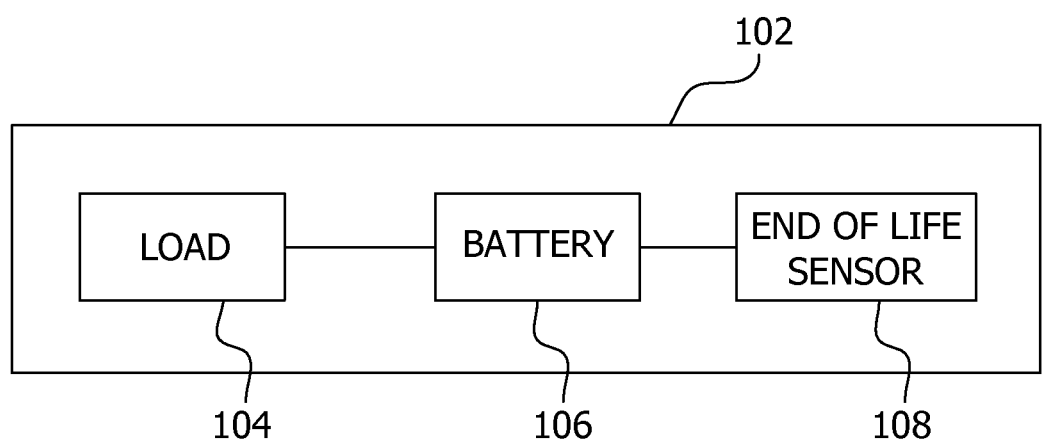
FIG. 19 illustrates a block diagram of a device according to various embodiments that include a load, a battery and an EOL sensor.

According to various embodiments, FIG. 19 illustrates a block diagram of a device 102 (i.e., an electronic device) including a load 104, a battery 106 (i.e., an electrochemical device) and an EOL sensor 108. Device 102 may be a computer, a communications device, an implantable medical device, a sensor, or any other device that provides power to load 104 from battery 106. Use of device 102 causes battery 106 to discharge to an EOL condition such that the battery 106 may be unable to continue to supply energy to load 104.

Battery 106, in various embodiments, may be a rechargeable type (secondary) or a non-rechargeable type (primary) battery. Where battery 106 is a secondary battery, battery 106 may be recharged to a useful voltage level instead of replacing the battery 106. In one embodiment, sufficient warning is provided to a user of device 102 for the battery 106 to be recharged or replaced without substantial interruption of the use of device 102.

Various embodiments of EOL sensor 108 may provide a priori information relating to battery 106, device 102, load 104, and components thereof to facilitate determining information relating to an EOL condition of battery 106. This EOL information may be used to signal or notify a user of and/or monitoring device associated with device 102 of an impending EOL condition of battery 106. Sufficient warning may be provided so that the battery may be replaced or recharged without substantial interruption in the use of device 102.

Figure 20:
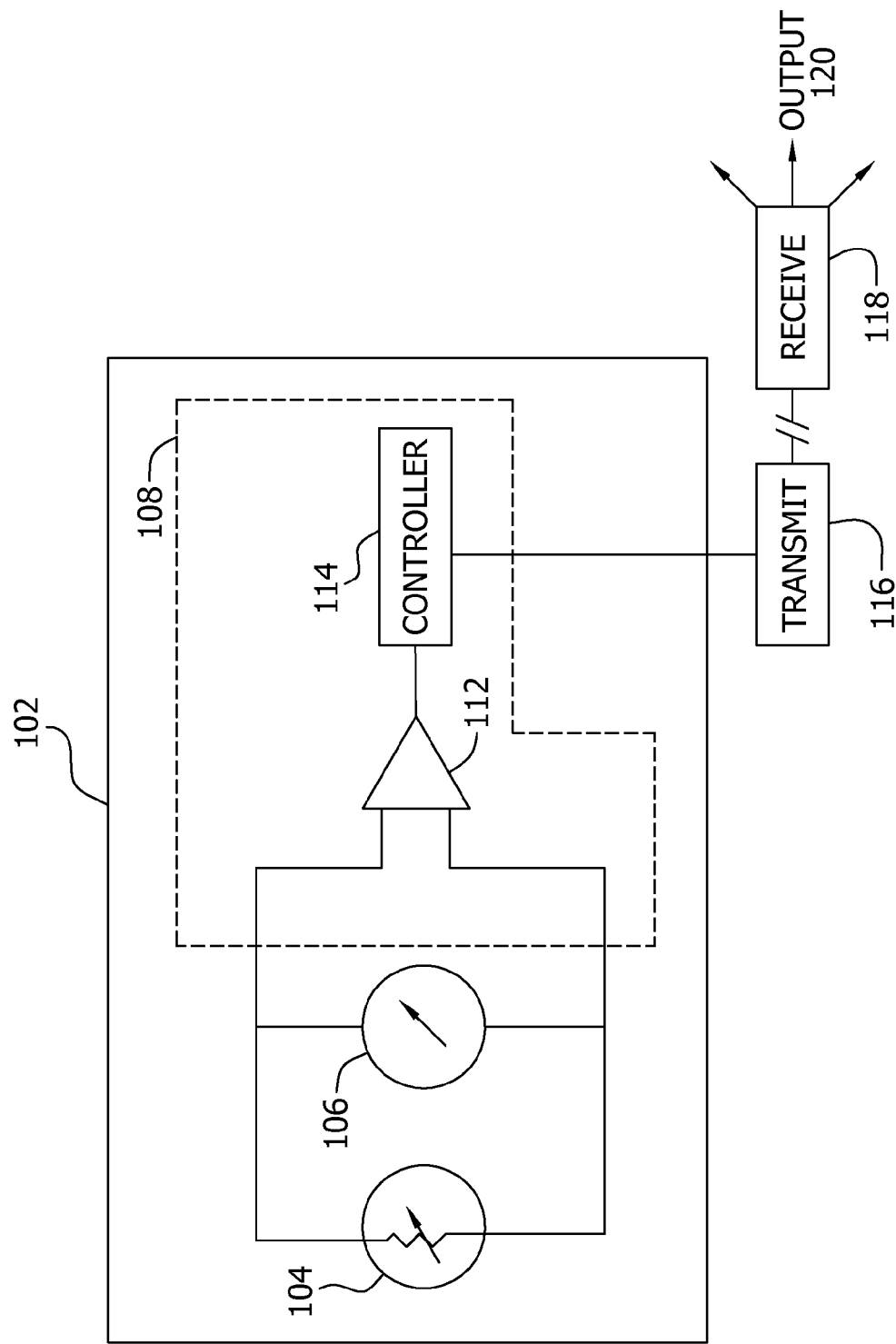
FIG. 20 illustrates a block diagram of a device according to various embodiments that utilizes sense and control functions, together with a transmitter and a receiver.

FIG. 20 illustrates a transmit component 116, a receive component 118, and output 120 in accordance with various embodiments. EOL sensor 108 comprises sense component 112 and controller 114 configured to sense and/or determine an EOL condition of battery 106. Direct or indirect methods may be utilized to measure physical parameters (e.g., temperature, voltage, current, strain, humidity, etc.) of battery 106 that can be used to predict an EOL condition of battery 106.

Sense component 112 may be configured to facilitate determining the EOL condition of battery 106, by sensing one or more physical parameters of battery 106. Physical parameters may include (but are not limited to), voltage, current, time, temperature and strain. Direct contact between sense component 112 and battery 106 may be utilized to facilitate accurate measurement of these parameters. For example, measuring voltage may utilize a direct connection of voltmeter probe(s) to battery 106, or temperature measurement may utilize direct physical contact of a thermistor or thermometer to battery 106. Direct methods include (but are not limited to) analog, digital and/or other comparison techniques.

In accordance with various embodiments, indirect methods may be utilized to measure physical parameters associated with an EOL condition because direct contact may not be available and/or possible. For example, measuring the voltage of an implanted pace maker battery may not be possible because the battery may not be exposed for direct measurement. Indirect measurement techniques may include (but are not limited to) induction, capacitance, light coupling and sound coupling, and are discussed further below.

Controller 114, in various embodiments, may be implemented as hardware, software or a combination of both. Controller 114 may be programmable, and may receive input from sense component 112. Controller may apply application logic to the input signal(s), for example, those signals received from sense component 112, and may provide output signal(s) for further system use. Controller 114 may affect how the EOL condition of battery 106 is determined based on physical parameters of battery 106 that may be measured by sense component 112.

In accordance with various embodiments, and with reference to FIG. 21, controller 114 may comprise various functional elements, such as analog to digital converter 122, sleep timer 124, EOL function 126, and communication function 128. Other functions may be present in controller 114 without departing from the scope of this disclosure.

Controller 114 may be configured to receive energy from battery 106. Controller 114 may thus act as an additional load on battery 106 that further shortens the expected life of battery 106. In accordance with various embodiments, controller 114 may be configured to reduce or eliminate energy it draws from battery 106. Energy requirements for controller 114 may be minimized (thereby extending the life of battery 106) by placing controller 114 in a sleep mode when not needed, for example, using sleep timer 124. In sleep mode, only certain control functions may be powered, so the energy utilized by controller 114 may be considerably reduced. Controller 114 may be awakened from sleep mode by a command or an internal timer (i.e., sleep timer 124), and may then begin performing other functions. In an embodiment, controller 114 may contain its own internal source of energy and therefore not affect the expected life of battery 106.

In accordance with various embodiments, transmit element 116 may be configured to communicate information regarding an approaching EOL condition. Transmit element 116 may be configured to communicate with or warn a user of device 102 that battery 106 is approaching an EOL condition. Sufficient warning may be provided so that battery 106 may be recharged or replaced without substantial interruption in the use of device 102. Local audible and/or visual alarms such as bells, whistles and flashing lights may be used to communicate the approaching EOL condition. The transmit element 116 may be integral with the EOL sensor 108, controller 114, or separate.

In various embodiments, the transmit component 116 is a transmitter and may employ wireless transmission to communicate the approaching EOL, for example, where the transmission occurs over a distance. Wireless transmission may utilize transmitter 116 located near device 102 and/or battery 106. A receiver 118 may be located remotely some distance away from device 102, and may be configured to receive the communication regarding the approaching EOL condition of battery 106. Transmission and reception techniques may be analog or digital or a combination of both. Any technique for transmitting and/or receiving information, whether now known or hereafter developed is contemplated within the scope of this disclosure. Receiver 118 may be configured to generate various outputs 120, for example, via the Internet, Bluetooth communication, radio frequency communication, network-based communication, and the like. Output 120 may be in any format that is configured to provide information regarding the EOL condition to a device monitor and/or user to facilitate replacement or recharging of battery 106.

As used herein, the term "network" may include any electronic communications system or method which incorporates hardware and/or software components. Communication among the parties may be accomplished through any suitable communication channels, such as, for example, a telephone network, an extranet, an intranet, Internet, point of interaction device (point of sale device, personal digital assistant (e.g., Palm Pilot®, Blackberry®), cellular phone, kiosk, etc.), online communications, satellite communications, off-line communications, wireless communications, transponder communications, local area network (LAN), wide area network (WAN), virtual private network (VPN), networked or linked devices, keyboard, mouse and/or any suitable communication or data input modality.

In accordance with various embodiments, and with reference to FIG. 22, a method for sensing and communicating an approaching EOL condition is disclosed. At step 130, sleep timer 124 may determine whether or not it is time to check a condition associated with battery 106, such as a discharge voltage of the battery. If it is not time to check the condition, then controller 114 remains in sleep mode. If it is time to check the condition, controller 114 wakes up and senses the condition at step 132. If the condition does not meet a predetermined threshold (e.g., a voltage level), then the controller 114 returns to sleep mode. If the condition does meet the threshold, then controller 114 provides a signal to transmitter 116 for transmission to receiver 118 at step 136. Receiver 118 then receives the transmission at step 138. Reception of the transmission may then facilitate notifying a monitoring device and/or user of the battery 106 of the approaching EOL condition.

As noted above, in various embodiments, direct contact measurement techniques (e.g., direct contact volt meter) may be utilized to sense a condition of battery 106. Direct contact measurement may, however, be difficult or impossible in certain embodiments because battery 106 may be physically isolated and therefore not accessible by a direct contact measurement device. For example, battery 106 may be physically isolated due to a protective covering that may not be breached without compromising the functionality and/or integrity of battery 106.

In an embodiment, a capacitance technique may utilize electric field measurements to sense a condition of battery 106 that includes a protective covering. An internal plate within battery 106 may be charged to the battery potential, thereby creating an electric field. Sense component 112 may comprise an external plate outside of battery 106, which may be disposed proximate the internal plate, without penetrating the protective covering. The external plate may facilitate sensing the electric field generated by the internal plate through the protective covering. Controller 114 may then utilize the sensed electric field to calculate and/or decode the electric field information in order to determine the condition of the battery (e.g., voltage). If the condition information indicates an approaching EOL condition of battery 106, this information may be transmitted from transmitter 116 to receiver 118 to facilitate replacement or recharging of battery 106. In various embodiments, this method may not require energy from battery 106 to sense the condition of battery 106, thereby reducing the load on the battery.

Further, in accordance with various embodiments, a light transmission technique may be utilized to facilitate sensing a condition of battery 106. Battery 106 may comprise a voltage sensing circuit, or the voltage sensing circuit may be disposed within the same protective covering that houses battery 106. Sense component 112 may comprise a portion within the protective covering and/or a portion external to the protective covering. For example, the voltage sensing circuit within the protective covering may be powered by battery 106 and may be configured to sense a discharge voltage of the battery, and the sensed voltage may then be coded into light. In various embodiments, the light may be amplitude or frequency modulated, using analog or digital signals. This light information may then be transmitted through the protective covering and received on the other side of the protective coating by a portion of sense component 112. Controller 114 may then be configured to decode the light information in order to determine the sensed voltage, and the sensed voltage may then be transmitted and received to facilitate replacement or recharging of battery 106. In various embodiments, visible or non-visible light may be transmitted at any wavelength that is capable of being read and/or measured by a detector.

Sound transmission techniques may be utilized according to various embodiments to facilitate sensing an end of life condition of battery 106. Based on the structure and/or composition of device 102 and/or battery 106, information regarding the propagation of sound waves through various materials in device 102 and/or battery 106 may facilitate sensing the end of life condition of battery 106. Audible and/or non-audible sounds across the spectrum may be used to facilitate sensing the end of life condition. Battery 106 may comprise a voltage sensing circuit, or the voltage sensing circuit may be disposed within the same protective covering that houses battery 106. Sense component 112 may comprise a portion within the protective covering and a portion external to the protective covering. For example, the voltage sensing circuit within the protective covering may be powered by battery 106 and may be configured to sense a discharge voltage of the battery 106, and the sensed voltage may then be coded into sound information. In various embodiments, the sound may be amplitude or frequency modulated, using analog or digital signals. This sound information may then be transmitted through the protective covering and received on the other side of the protective coating by a portion of sense component 112. Controller 114 may then be configured to decode the sound information in order to determine the sensed voltage, and the sensed voltage may then be transmitted and received to determine an end of life condition of the battery 106 to facilitate replacement or recharging of battery 106.

Inductive techniques may be utilized according to various embodiments to use electromagnetic field measurements to sense an end of life condition of battery 106. A coil internal to battery 106 and/or within the protective covering surrounding battery 106 may be charged to the potential of battery 106, thereby generating an electromagnetic field. Sense component 112 may be configured to sense the electromagnetic field through the protective covering around battery 106. For example, sense component 112 may comprise an external coil that may be passed over the coil located within the protective covering, without penetrating the protective covering, and without drawing energy from battery 106. The electromagnetic field induces a current in the external coil, and controller 114 may decode the induced current to determine the discharge voltage and/or other physical parameters of the battery 106. The sensed voltage may then be transmitted and received to facilitate replacement or recharging of battery 106 in response to determining an end of life condition of the battery.

Mechanical techniques may be utilized according to various embodiments to facilitate non-contact sensing of a condition of battery 106. For example, motion sensing and/or recognition may be utilized to facilitate determining the condition. Based on the known structure and/or composition of device 102 and/or battery 106, information regarding the transmission of mechanical energy (e.g., pressure and vibration) through various materials in device 102 and/or battery 106 may facilitate determining the condition of battery 106. Sense component 112 may comprise a portion within the protective covering and a portion external to the protective covering. For example, a voltage sensing circuit may be disposed within the protective covering, and may be powered by battery 106. The voltage sensing circuit may be configured to sense a discharge voltage, and the sensed voltage may then trigger a mechanical response and/or movement. In various embodiments, the mechanical response may be amplitude or frequency modulated, using analog or digital signals. The mechanical response may then be transmitted through the protective covering and received on the other side of protective coating by a portion of sense component 112. Controller 114 may then be configured to decode the mechanical response (e.g., physical response, pressure detection, vibration detection) in order to determine the sensed voltage, and the sensed voltage may then be transmitted and received to facilitate replacement or recharging of battery 106 in response to determining an end of life condition of the battery.

Electrical techniques may be utilized according to various embodiments to facilitate non-contact sensing of a condition of battery 106. For example, radio frequency (RF) transmission across the entire electrical frequency spectrum may be utilized to facilitate sensing the condition of battery 106 by using the principle of electrical frequency signal propagation through different mediums (e.g., through air via an antenna). Based on the known structure and/or composition of device 102 and/or battery 106, information regarding the transmission of RF signals through various materials and/or mediums in device 102 and/or battery 106 may facilitate determining the condition of battery 106. Such electrical techniques may facilitate transmission of the condition of battery 106 over greater distances. For example, a voltage sensing circuit may be part of battery 106 or may be on the same side of the protective covering as battery 106, and may utilize energy from battery 106. A discharge voltage sensed by the voltage sensing circuit may be coded into an electrical frequency signal, and the electrical signal may be amplitude or frequency modulated, using analog or digital signals. The electrical signal may then be transmitted through the protective covering of battery 106 at any distance over which various electrical signals may travel. Controller 114 may then decode the electrical signal to determine the sensed voltage of battery 106, and the sensed voltage may then be transmitted and received to facilitate replacement or recharging of battery 106 in response to determining an end of life condition of the battery.

Device 102 according to various embodiments may utilize energy from battery 106 to power components of sense element 112 and/or controller 114. Such energy utilization may reduce the useful life of battery 106 due to the additional load. Various techniques may be utilized alone or in combination to minimize, reduce, and/or eliminate the additional load such as a sleep mode technique, an external interrupt technique and/or external and alternative power sources.

Sleep mode techniques may by implemented using a microprocessor or microcontroller system, for example, within controller 114. Sleep function 124 may be configured to wake up controller 114, sense element 112, or other components of device 102 at fixed, periodic, and/or predetermined time intervals. By allowing various device components to be inactive during certain times (e.g., internal subsystems may be turned off except for an internal timer), the load on battery 106 may be reduced. The internal timer (e.g. sleep timer 124) may be configured to activate various components of device 102 to facilitate sensing a physical parameter of battery 106. The parameter may then be sensed and transmitted if necessary to facilitate replacing or recharging battery 106 in response to determining an end of life condition of the battery. If the condition is at an acceptable level, then sleep timer 124 may cause the various components of device 102 to again return to sleep or otherwise become inactive.

An external interrupt technique may be utilized according to various embodiments to reduce the additional load on battery 106. Voltage checks at regular intervals as discussed above may not be necessary in some circumstances, for example, a newer battery may not need to be checked as frequently as an older battery. An external interrupt technique may utilize an external command that may be sensed by controller 114 or sense element 112, and the external command may instruct sense element 112 to sense the discharge voltage of battery 106. Any change in a physical parameter and/or characteristic may be utilized to trigger the sensing of a voltage of the battery 106. For example, if battery 106 is pressed, it may trigger sense element 112 to sense the voltage of the battery 106. Sensing the voltage of battery 106 only when necessary may further alleviate the load on battery 106, thereby extending the useful life of the battery 106.

Techniques according to various embodiments may utilize an alternative power source other than battery 106 to facilitate sensing, determining, and/or transmitting an indication of an end of life condition of the battery in order to reduce the load on battery 106. For example, an additional battery may be used solely to power the components of device 102 other than the load 104. Further, energy may be converted from other sources, such as from body temperature, blood flow, and/or blood pressure in order to power the components of the device 102 other than the load 104. Any means for powering various components of device 102 is contemplated within the scope of the present disclosure.

Figure 4:
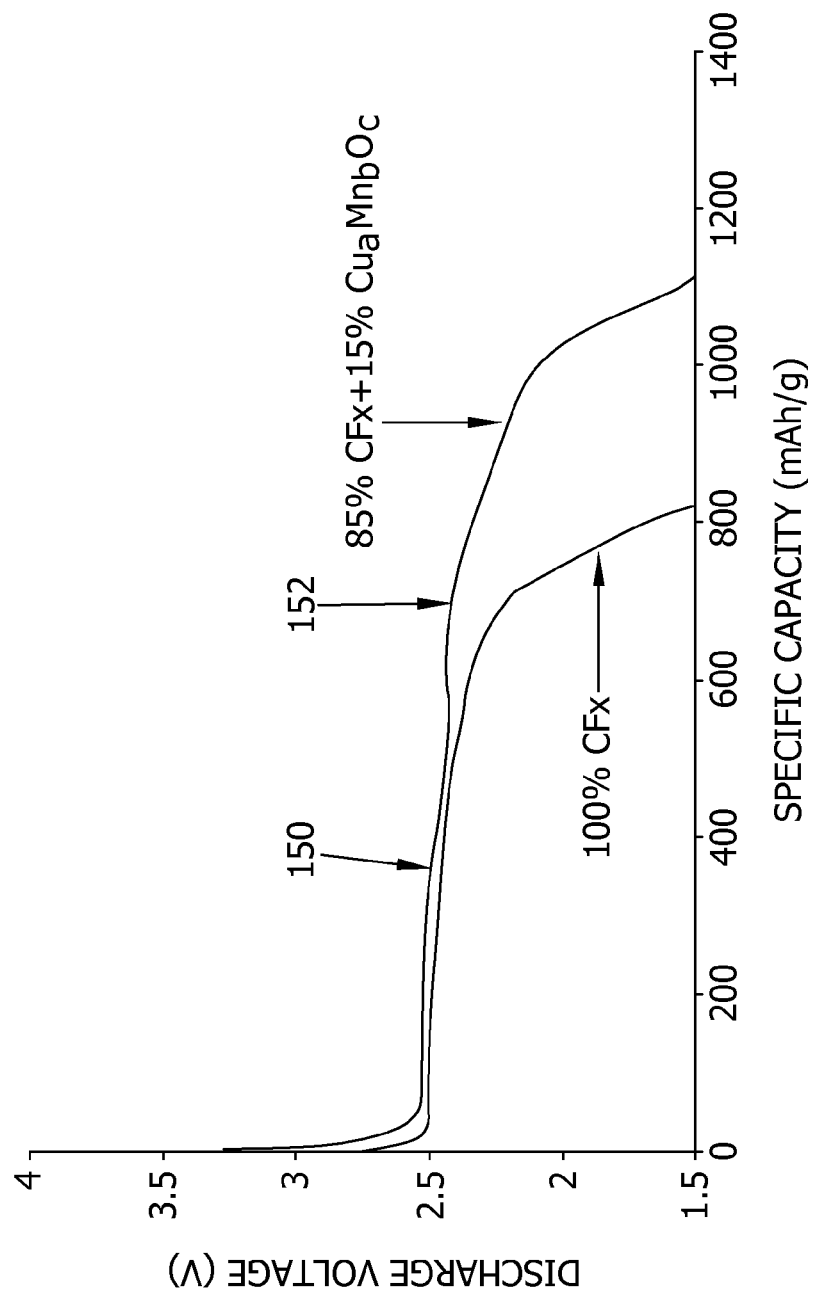
FIG. 4 illustrates discharge voltage profiles according to yet another embodiment of the copper manganese oxide ($Cu_a Mn_b O_c$)/$CF_x$ (15/85) cathode material of the present disclosure, versus a sample of $CF_x$ alone.

Any cell chemistry having discharge characteristics that facilitate sensing an EOL condition in accordance with this disclosure are contemplated within the scope of this disclosure. In accordance with an embodiment, Lithium (Li) Carbon Monofloride (CFx) cells that have Copper Manganese Oxide (CuMnO) as an active component of the cathode may exhibit discharge characteristics that facilitate sensing an EOL condition of the cells. With reference to FIG. 4, during discharge, the CuMnO cell may exhibit two intervals or plateaus with a relatively constant slope. The first interval 150 may occur at the beginning of life for the cell. The second interval 152 may occur towards the EOL of the cell. This a priori second plateau 152 relating to the EOL condition may be used as an indication of the impending EOL of a CuMnO cell. Any other cell chemistry with discharge profiles, slopes, intervals, and/or plateaus that may facilitate sensing an EOL condition are contemplated within the scope of the present disclosure.

It should be understood that various principles of the disclosure have been described in illustrative embodiments. However, many combinations and modifications of the above described formulations, proportions, elements, materials, and components used in the practice of the invention, in addition to those not specifically described, may be varied and particularly adapted to specific environments and operating requirements without departing from those principles. Other variations and modifications of the present disclosure will be apparent to those of ordinary skill in the art, and it is the intent that such variations and modifications be covered by this disclosure.

Further, the description of various embodiments herein makes reference to the accompanying drawing figures, which show the embodiments by way of illustration and not of limitation. While these embodiments are described in sufficient detail to enable those skilled in the art to practice the invention, it should be understood that other embodiments may be realized and that logical and mechanical changes may be made without departing from the spirit and scope of the invention. Thus, the disclosure herein is presented for purposes of illustration only and not of limitation. For example, the steps recited in any of the method or process descriptions may be executed in any order and are not limited to the order presented. Moreover, any of the functions or steps may be outsourced to or performed by one or more third parties. Furthermore, any reference to singular includes plural embodiments, and any reference to more than one component may include a singular embodiment.

One skilled in the art is familiar with conventional data networking, application development and traditional electrical circuits of the systems (and components of the individual operating components of the systems) described herein, such that a detailed description of these known components, applications, and networks is unnecessary herein. Furthermore, the connecting lines shown in the various figures contained herein are intended to represent exemplary functional relationships and/or physical couplings between the various elements. It should be noted that many alternative or additional functional relationships or physical connections may be present in a practical system.

Additionally, functional blocks of the block diagrams and flowchart illustrations provided herein support combinations of means for performing the specified functions, combinations of steps for performing the specified functions, and program instruction means for performing the specified functions. It will also be understood that each functional block of the block diagrams and flowchart illustrations, and combinations of functional blocks in the block diagrams and flowchart illustrations, may be implemented by either special purpose hardware-based electronics and/or computer systems which perform the specified functions or steps, or suitable combinations of special purpose hardware and computer instructions.

Benefits, other advantages, and solutions to problems have been described herein with regard to specific embodiments. However, the benefits, advantages, solutions to problems, and any elements that may cause any benefit, advantage, or solution to occur or become more pronounced are not to be construed as critical, required, or essential features or elements of the invention. The scope of the invention is accordingly to be limited by nothing other than the claims that may be included in an application that claims the benefit of the present application, in which reference to an element in the singular is not intended to mean "one and only one" unless explicitly so stated, but rather "one or more." Moreover, where a phrase similar to "at least one of A, B, and C" may be used in the claims, it is intended that the phrase be interpreted to mean that A alone may be present in an embodiment, B alone may be present in an embodiment, C alone may be present in an embodiment, or that any combination of the elements A, B, and C may be present in a single embodiment; for example, A and B, A and C, B and C, or A and B and C. Although certain embodiments may have been described as a method, it is contemplated that the method may be embodied as computer program instructions on a tangible computer-readable carrier and/or medium, such as a magnetic or optical memory or a magnetic or optical disk. All structural, chemical, and functional equivalents to the elements of the above-described embodiments that are known to those of ordinary skill in the art are contemplated within the scope of this disclosure.

Having described the disclosure in detail above, it will be apparent that modifications and variations are possible without departing from the scope of the disclosure defined in the appended claims.

The following non-limiting examples are provided to further illustrate the various details and embodiments of the present disclosure.

EXAMPLES

Example 1

$Cu_aMn_bO_c$ was prepared as follows:

$CuSO_4 \cdot 5H_2O$ (0.25 moles) and $MnSO_4 \cdot H_2O$ (0.25 moles) were dissolved in an appropriate amount of deionized water to form a solution. About 100 grams of potassium hydroxide solution (20%) were added drop-wise to the stirred solution of copper and manganese sulfate. The resulting precipitate was collected by filtration and thoroughly washed with deionized water, and dried at 60° C. for about 24 hours. The dried material was then placed in an oven and heated in air at approximately 250° C. for about 15 hours. Finally, the product was ground using mortar and pestle and sieved through a sieve of 60-micron mesh.

Example 2

$Cu_aMn_bO_c$ was prepared as follows:

$CuSO_4 \cdot 5H_2O$ (0.05 moles) and $MnSO_4 \cdot H_2O$ (0.05 moles) were dissolved in an appropriate amount of deionized water to form a solution. Then, the resulting solution was added drop-wise to stirred solution of 20% KOH containing $KClO_4$ (0.0125 moles), which is used as an oxidizing agent. When the addition of the solution was completed, the reaction mixture was stirred for about 4 hours. The resulting precipitate was filtered and washed thoroughly and deionized with water. The material was dried at approximately 60° C. for about 24 hours. Prior to being used as a cathode active material, the dried sample was heat-treated at approximately 250° C. for up to 24 to 72 hours, or at about 400° C. for approximately two hours. Optionally, the dried sample may be heat-treated at approximately 250° C. for about 15 hours.

Example 3

$CuSO_4 \cdot 5H_2O$ (0.05 moles), $MnSO_4 \cdot H_2O$ (0.05 moles) and $K_2S_2O_8$ (0.0125 moles) were dissolved in an appropriate amount of deionized water to form a solution. Then, the resulting solution was added drop wise to a stirred solution of 20% KOH. When the procedure was completed, the precipitate was aged at room temperature in mother liquor for about 4 hours while stirring. The aged precipitate was filtered and washed thoroughly with deionized water. The material was dried at about 60° C. for approximately 24 hours. Prior to being used as a cathode active material, the dried sample was heat-treated at approximately 250° C. for up to 24 to 72 hours, or at about 400° C. for approximately two hours. Optionally, the dried sample may be heat-treated at approximately 250° C. for about 15 hours.

Example 4

$Cu_aMn_bO_c$ was prepared as follows:

$CuSO_4.5H_2O$ (1.5 moles) and $MnSO_4.H_2O$ (0.25 moles) were dissolved in an appropriate amount of deionized water to form a solution. About 100 grams of potassium hydroxide solution (20%) were added drop-wise to the stirred solution of copper and manganese sulfate. The resulting precipitate was collected by filtration and thoroughly washed with deionized water, and dried at 60° C. for 24 hours. The dried material was then placed in an oven and heated in air at approximately 250° C. for about 15 hours. Finally, the product was ground using mortar and pestle and sieved through a sieve of 60-micron mesh.

It is to be noted that $Cu_aMn_bO_c$ materials from precursors containing different Cu:Mn molar ratios other than 6:1 can be prepared using the above described method.

Example 5

$Cu_aMn_bO_c$ was prepared as follows:

$CuSO_4.5H_2O$ (1.5 moles) and $MnSO_4.H_2O$ (0.25 moles) were dissolved in an appropriate amount of deionized water to form a solution. Then, the resulting solution was added drop-wise to stirred solution of 20% KOH containing $KClO_4$ (0.125 moles), which is used as an oxidizing agent. When the addition of the solution was completed, the reaction mixture was stirred for about 4 hours. The resulting precipitate was filtered and washed thoroughly and deionized with water. The material was dried at approximately 60° C. for 24 hours. Prior to being used as a cathode active material, the dried sample was heat-treated at approximately 250° C. and 400° C. for about 15 and 2 hours, respectively.

It is to be noted that $Cu_aMn_bO_c$ materials from precursors containing different copper to manganese molar ratios other than 6:1 can be also prepared using the above described method.

Example 6

$CuSO_4.5H_2O$ (1.5 moles), $MnSO_4.H_2O$ (0.25 moles) and $K_2S_2O_8$ (0.0125 moles) were dissolved in an appropriate amount of deionized water to form a solution. Then, the resulting solution was added drop wise to a stirred solution of 20% KOH. When the procedure was completed, the precipitate was aged at room temperature in mother liquor for about 4 hours while stirring. The aged precipitate was filtered and washed thoroughly with deionized water. The material was dried at about 60° C. for approximately 24 hours. Prior to being used as a cathode active material, the dried sample was heat-treated at approximately 250° C. and 400° C. for about 15 and 2 hours, respectively.

Example 7

$CuSO_4.5H_2O$ (1.5 moles), $MnSO_4.H_2O$ (0.25 moles), $C_6H_8O_7$ (2 moles) and $K_2S_2O_8$ (0.0125 moles) were dissolved in an appropriate amount of deionized water to form a solution, which has a pH of about 1.3. Then, 20% KOH solution was added drop wise to the stirred solution until the pH of about 13 was reached, at which point precipitation of product is complete. When the procedure was completed, the precipitate was aged at room temperature in mother liquor for about 45 minutes while stirring. The aged precipitate was filtered and washed thoroughly with deionized water. The material was dried at about 60° C. for approximately 24 hours. Prior to being used as a cathode active material, the dried sample was heat-treated at approximately 250° C. and for about 15 hours. The corresponding copper to manganese molar ratio was 6:1.

Example 8

A sample of $Cu_aMn_bO_c$ was prepared as set forth in Example 7, except the copper to manganese molar ratio was 5:1 in the mixture solution.

Example 9

A sample of $Cu_aMn_bO_c$ was prepared as set forth in Example 7, except the copper to manganese molar ratio was 4:1 in the mixture solution.

Example 10

A sample of $Cu_aMn_bO_c$ was prepared as set forth in Example 7, except the copper to manganese molar ratio was 3:1 in the mixture solution.

Example 11

Test Cell

A first exemplary test cell was constructed to illustrate the characteristics of a cathode that comprises $Cu_aMn_bO_c$, as prepared in Examples 1-3, above. With reference to FIG. 1, an exemplary test cell comprises a housing X7, an anode X1, a cathode X3, a separator X5 and a non-aqueous electrolyte was prepared. The cell may be used either as a rechargeable or non-rechargeable electrochemical cell. In the cell, the anode X1 was configured to be in electrical contact with a negative lead X2, a cathode X3 was configured to be in electrical contact with a positive lead X4, a separator X5 was configured to electrically separate anode X1 and cathode X3, and an electrolyte permeated the separator X5. Anode X1, cathode X3, separator X5 and the electrolyte were configured to be contained within housing X7. One end of housing X7 was closed with a cap X6, and an annular insulating gasket or O-ring X8 was configured to provide a gas-tight and fluid-tight seal. Positive lead X4 was configured to connect cathode X3 to cap X6.

An electrochemical cell according to various embodiments may be of any configuration, such as a cylindrical wound cell, a button or coin cell, a prismatic cell, a rigid laminar cell or a flexible pouch, envelope or bag cell.

Example 12

Analysis/Testing of $Cu_aMn_bO_c$ Using Test Cell

Figure 2:
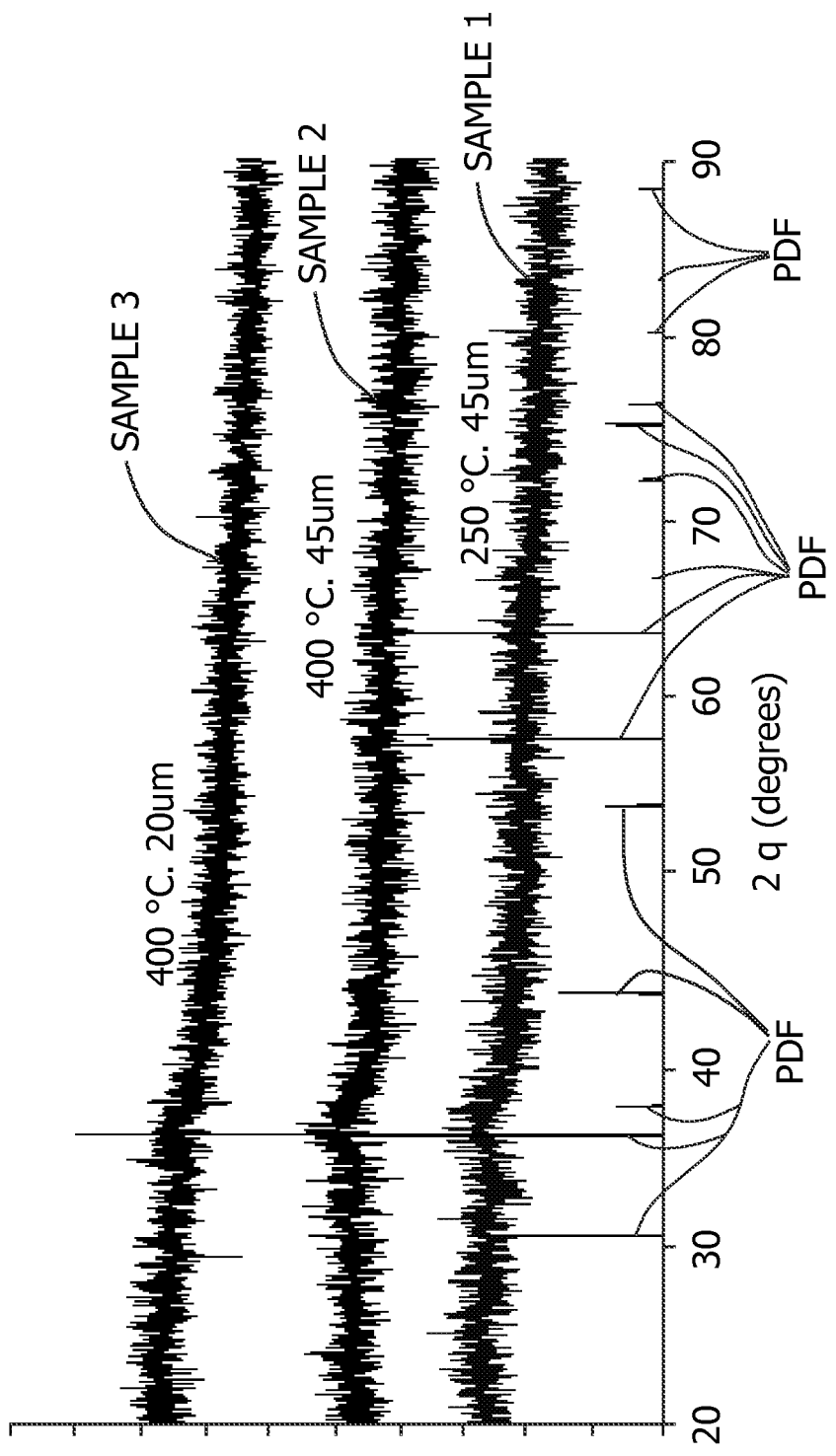
FIG. 2 illustrates an x-ray diffraction graph according to an embodiment of the copper manganese oxide cathode material of the present disclosure.

X-ray analysis that was performed on a 250° C. heat-treated CuMnO material of Example 3 described above revealed an amorphous structure as illustrated in FIG. 2 (the distinct or sharp peaks or signals at about 30, 36, 38, 44, 54, 58, 64, 68, 72, 76, 76, 81, 84 and 88 being PDF-related peaks). A similar structure was obtained on the sample that was heat-treated at about 400° C. for approximately 2 hours.

The electrochemical behavior of the $Cu_aMn_bO_c$ of Example 3 was evaluated in a pouch cell, constructed consistent with the details provided above, using lithium metal as an anode. The cathode consisted of 70% $Cu_aMn_bO_c$ as active material, 14% Super P carbon and 8% KS4 graphite as conductive fillers, and 8% PVDF as binder. $Cu_aMn_bO_c$, Super P and KS4 were first mixed through ball milling. Then the resulting dry mix was added to a PVDF dissolved in N-methyly-2-pyrrolidene (NMP) solution to form a slurry. Finally, the slurry was applied on a carbon coated aluminum foil substrate to form a cathode, using an electrode coater equipped with an oven to evaporate the NMP.

Figure 3:
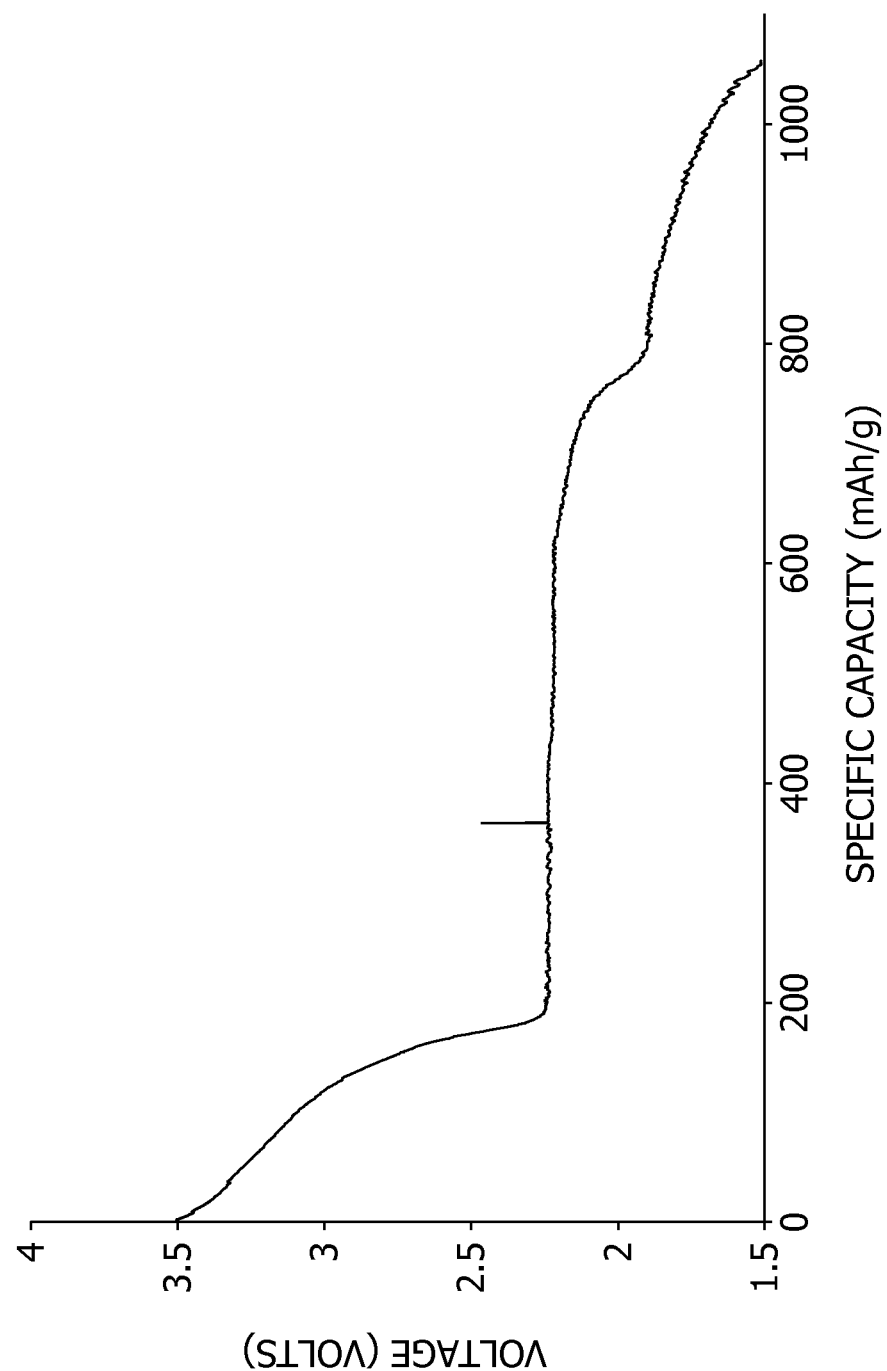
FIG. 3 illustrates a discharge voltage profile according to a further embodiment of the copper manganese oxide ($Cu_a Mn_b O_c$) cathode material of the present disclosure.

FIG. 3 shows the discharge profile of the Example 3 $Cu_aMn_bO_c$ cathode material discussed above in a pouch cell using lithium metal as an anode. The measurements were carried out at room temperature under galvanostic conditions, at a discharge rate of 10 milliamp per gram (mA/g) of cathode active material. The discharge capacity to 1.5 Volts is about 1060 mAh/g. In contrast, as illustrated on FIG. 4, a cell with a $CF_x$ electrode exhibits a specific capacity of approximately 860 mAh/g. Thus, the $Cu_aMn_bO_c$ material of the present disclosure provides an increased specific capacity over devices that include cathodes of $CF_x$.

Example 13

End-of-Life Indication

In accordance with various embodiments of the present disclosure, it has been observed that a cathode comprising $Cu_aMn_bO_c$ may exhibit discharge characteristics that facilitate end-of-life indication. For example, with reference to FIG. 3, after approximately 200 mAh/g, the voltage output of the cell decreased to a second discharge plateau and remained flat at 2.2V to approximately 700 mAh/g. This second plateau may advantageously be used in accordance with various aspects of the present disclosure to detect the end-of-life of the battery, for example when the cell is approaching the end of the discharge process. Such an end-of-life indication may be desirable in medical device applications where it may be desirable to surgically remove a medical device before the battery reaches the end of its lifetime, but not too early during its lifetime.

Example 14

Rechargeable Battery

Figure 5:
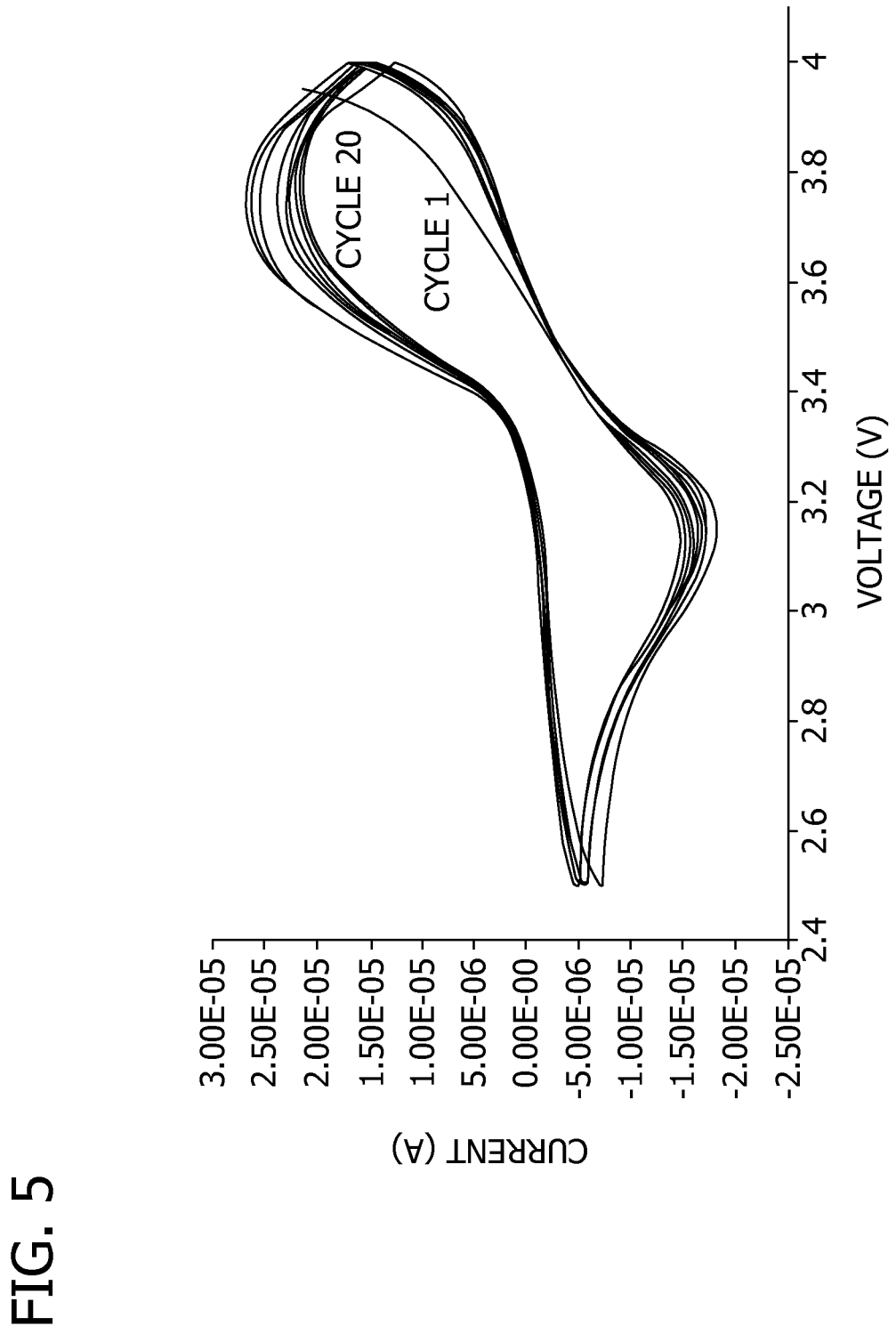
FIG. 5 illustrates cyclic voltammograms according to other embodiments of the present disclosure.
Figure 6:
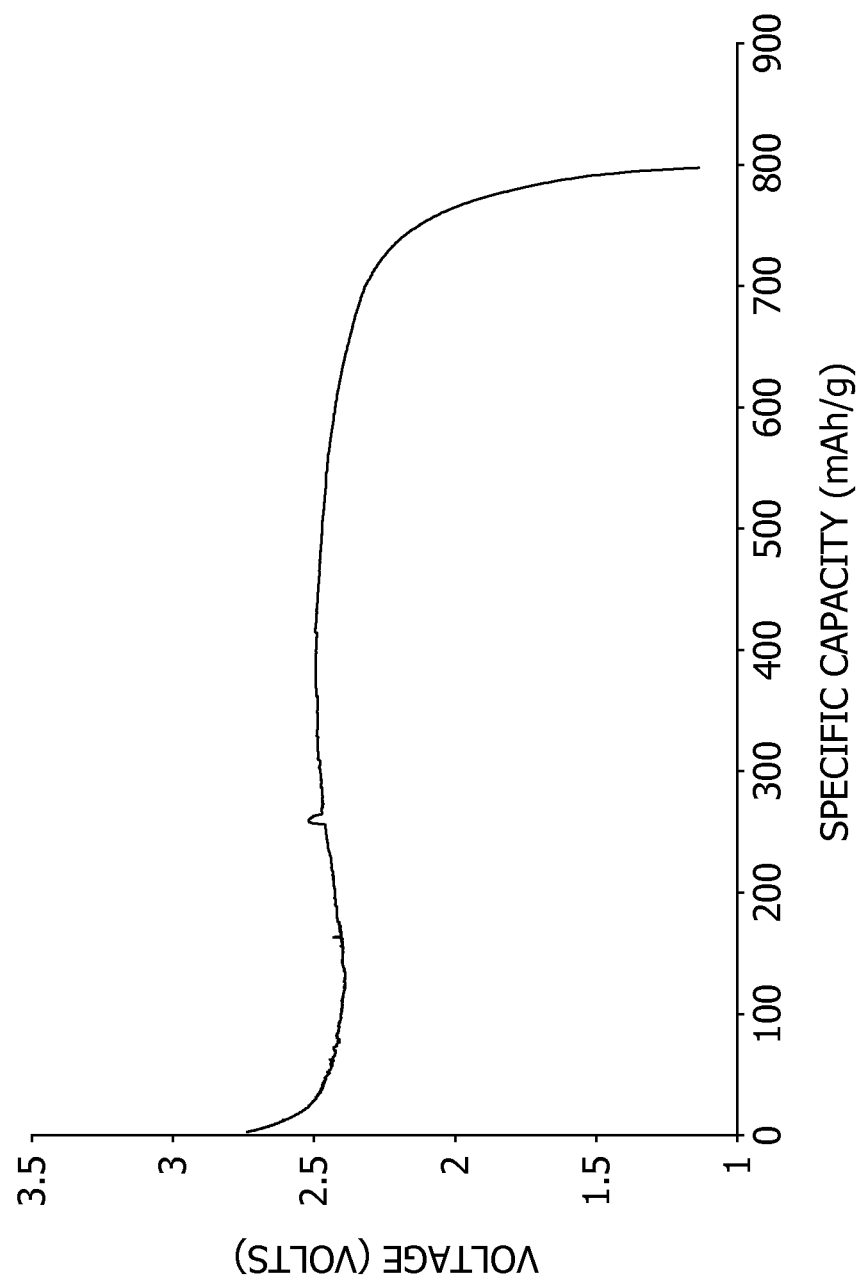
FIG. 6 illustrates a lithium $CF_x$ discharge profile.
Figure 7:
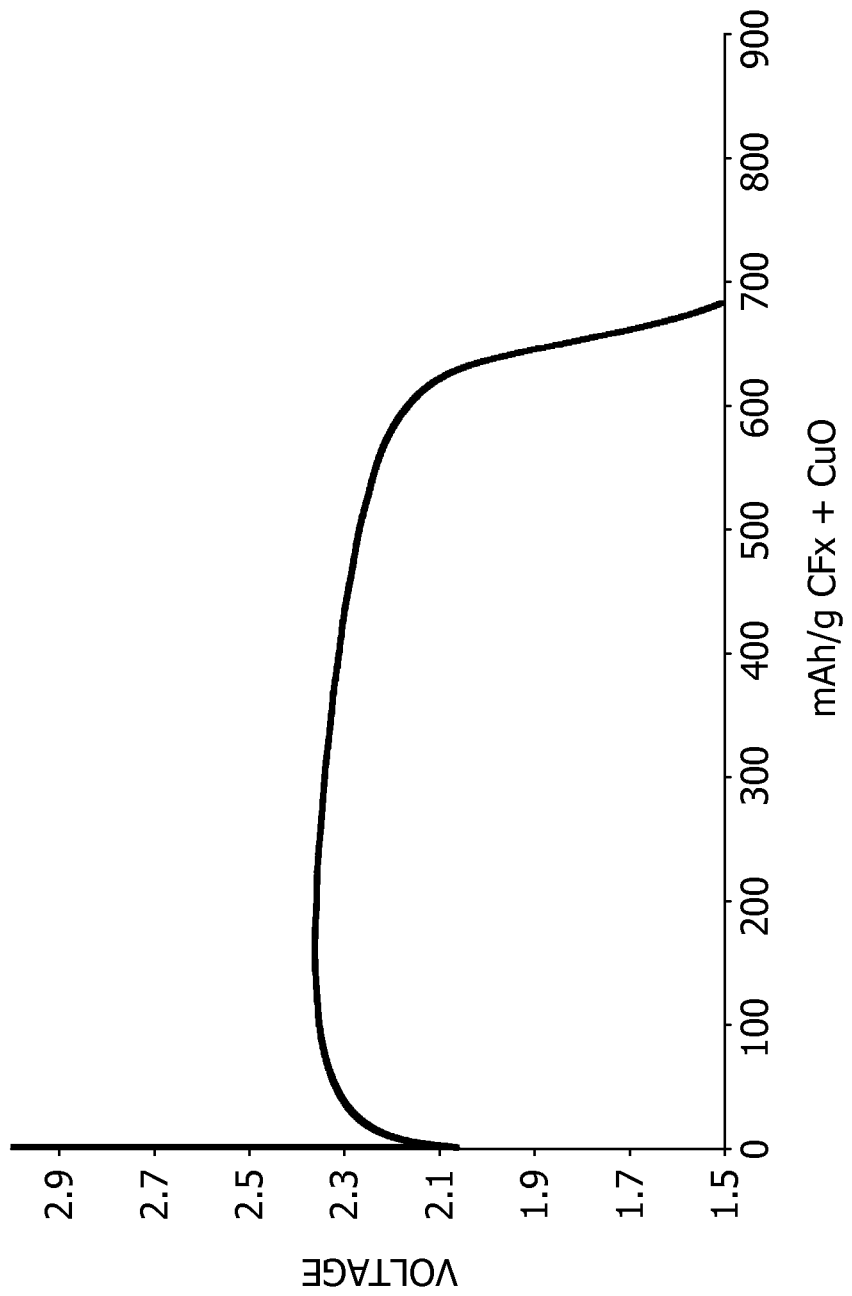
FIG. 7 illustrates a lithium $CF_x$/CuO discharge profile.

In still other embodiments, $Cu_aMn_bO_c$ may exhibit at least partial rechargeability and/or reversibility. FIG. 5 shows cyclic voltammograms of a $Cu_aMn_bO_c$ cathode in a pouch cell, indicating good reversibility of the cathode over approximately 4.0V to 2.5V. With reference back to FIG. 3, exemplary embodiments of the present disclosure that comprise a $Cu_aMn_bO_c$ cathode may be reversible during the first approximately 200 mAh/g of capacity. Thereafter, exemplary batteries may still comprise a capacity that is substantially similar to electrodes that comprise $CF_x$.

Example 15

Electrodes with $Cu_aMn_bO_c$ and $CF_x$

As previously noted, in one particular embodiment of the present disclosure, the cathode material may comprise $Cu_aMn_bO_c$ combined with one or more other cathode materials that have high specific capacity, such as fluorinated carbon (e.g., $CF_x$). A battery with a cathode that comprises $Cu_aMn_bO_c$ and $CF_x$ may exhibit enhanced electrochemical performance (e.g., specific energy, energy density, operating voltage, and rate capability) relative to a battery with $CF_x$ alone. Such a battery may also exhibit a more predictable voltage change during the last portion of its capacity, thereby producing a reliable indicator of the end of its useful life.

In a particular embodiment, $Cu_aMn_bO_c$ formed according to Example 3 above was mixed with fluorinated carbon, and more specifically $CF_x$ (having the composition $CF_1/CF_{0.6}$, in the ratio of 80/20) to form a cathode. The cathode active part of the blend consisting of 85% (by weight) carbon fluoride and 15% (by weight) $Cu_aMn_bO_c$ were mixed with Super P and KS4.

The discharge profile of the cell built with the cathode prepared from the noted cathode mixture at a discharge rate of 10 mA/g is illustrated in FIG. 4. Discharge data for cells built with carbon fluoride alone as active are provided in FIG. 4 for comparison. The specific capacity to 1.5 Volts of cells built with the admixture of carbon fluoride and $Cu_aMn_bO_c$ as cathode materials is about 1100 mAh/g. When evaluated alone, carbon fluoride based cells delivered a specific capacity to 1.5 Volts of about 820 mAh/g.

It is to be noted that the mixture of 85% $CF_x$, having an expected capacity of 704 mAh/g, and 15% $Cu_aMn_bO_c$, having an expected capacity of 1060 mAh/g, should have produced a hybrid cathode delivering a capacity of about 810 mAh/g. The new cathode instead produced an unexpected 36% greater capacity of 1100 mAh/g. The incorporation of the $Cu_aMn_bO_c$ according to embodiments of the present disclosure into carbon fluoride (or more generally fluorinated carbon) thus led to cells with about 56% capacity improvement, as compared to cells built with carbon fluoride alone as cathode active materials.

It is also to be noted that the cell exhibits two intervals or plateaus with a relatively constant discharge voltage. The first interval 150 occurs at the beginning of life for the cell. The second interval 152 occurs towards the EOL of the cell. This a priori second plateau 152 relating to the EOL may be used as an indication of the impending EOL of the cell. Any other cell chemistry with discharge profiles, slopes, intervals, and/or plateaus that may facilitate sensing an EOL condition are contemplated within the scope of the present disclosure.

Example 16

Test Cell

Figure 9:
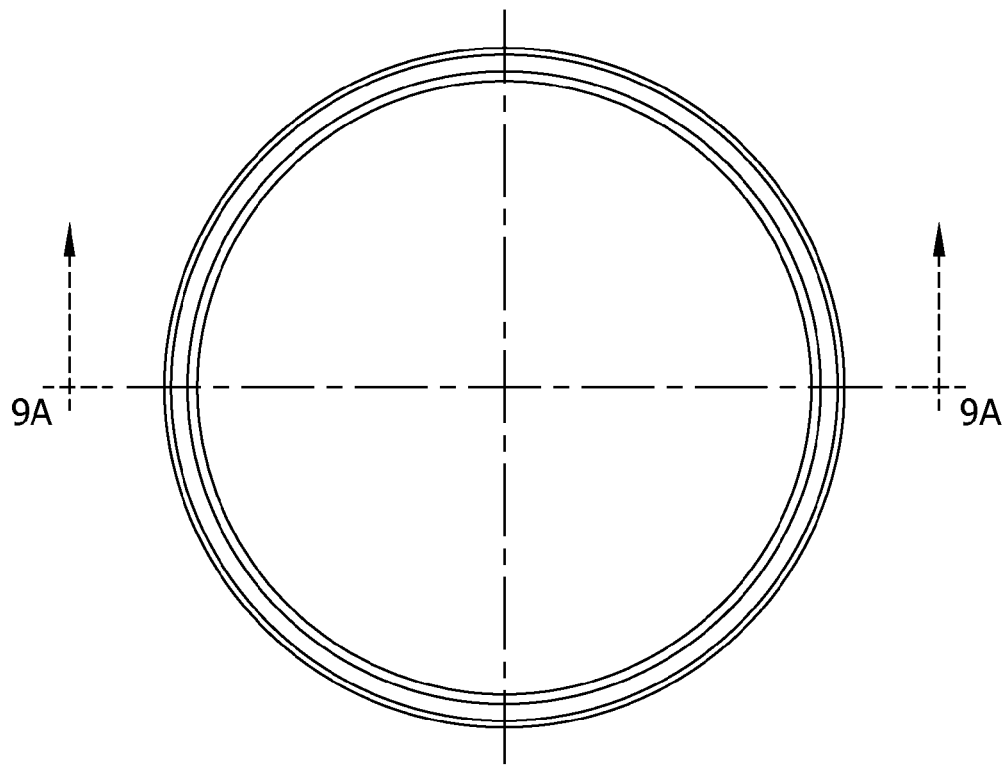
FIGS. 9 and 9A illustrate schematic drawings of a coin cell used for testing various alternative embodiments of the present disclosure, FIG. 9A being a schematic cross-section of the cell if FIG. 9 along line 9A.
Figure 9A:
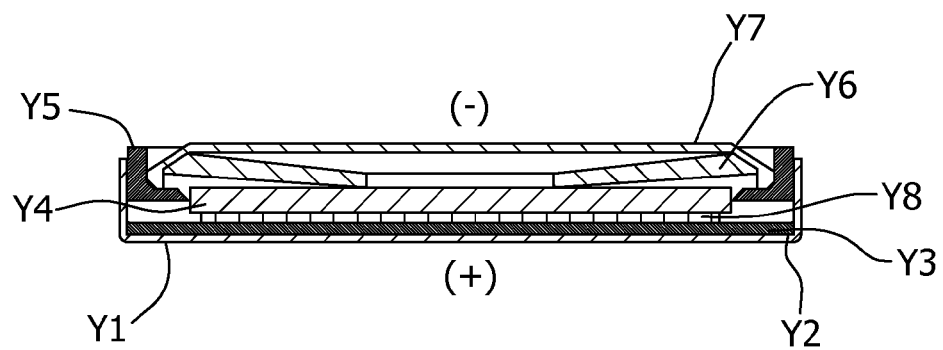

A second exemplary test cell was constructed to further illustrate the characteristics of a cathode that comprises $Cu_aMn_bO_c$, as prepared in Examples 4-10, above. Specifically, an exemplary coin cell battery, illustrated in FIGS. 9 and 9A, was used as a test vehicle (unless otherwise mentioned) to evaluate the discharge characteristics of a cathode that comprises $Cu_aMn_bO_c$. With reference to FIGS. 9 and 9A (FIG. 9A being a cross-section of FIG. 9, along the 9A line), an exemplary test cell comprised a cell can (Y1), a cathode (Y2), a separator (Y3), a non-aqueous electrolyte, a stainless steel spacer (Y4), a gasket (Y5), a Belleville spring (Y6), a cell cap (Y7) and an anode (Y8). The cell was used either as a rechargeable or non-rechargeable electrochemical cell. The anode, the cathode, the separator, and the electrolyte were configured to be contained within the cell can and cell cap.

Other electrochemical cells according to various embodiments may be of any configuration, such as a cylindrical wound cell, a prismatic cell, a rigid laminar cell or a flexible pouch, envelope or bag cell.

Example 17

Analysis/Testing of $Cu_aMn_bO_c$ Using Test Cell

Figure 11:
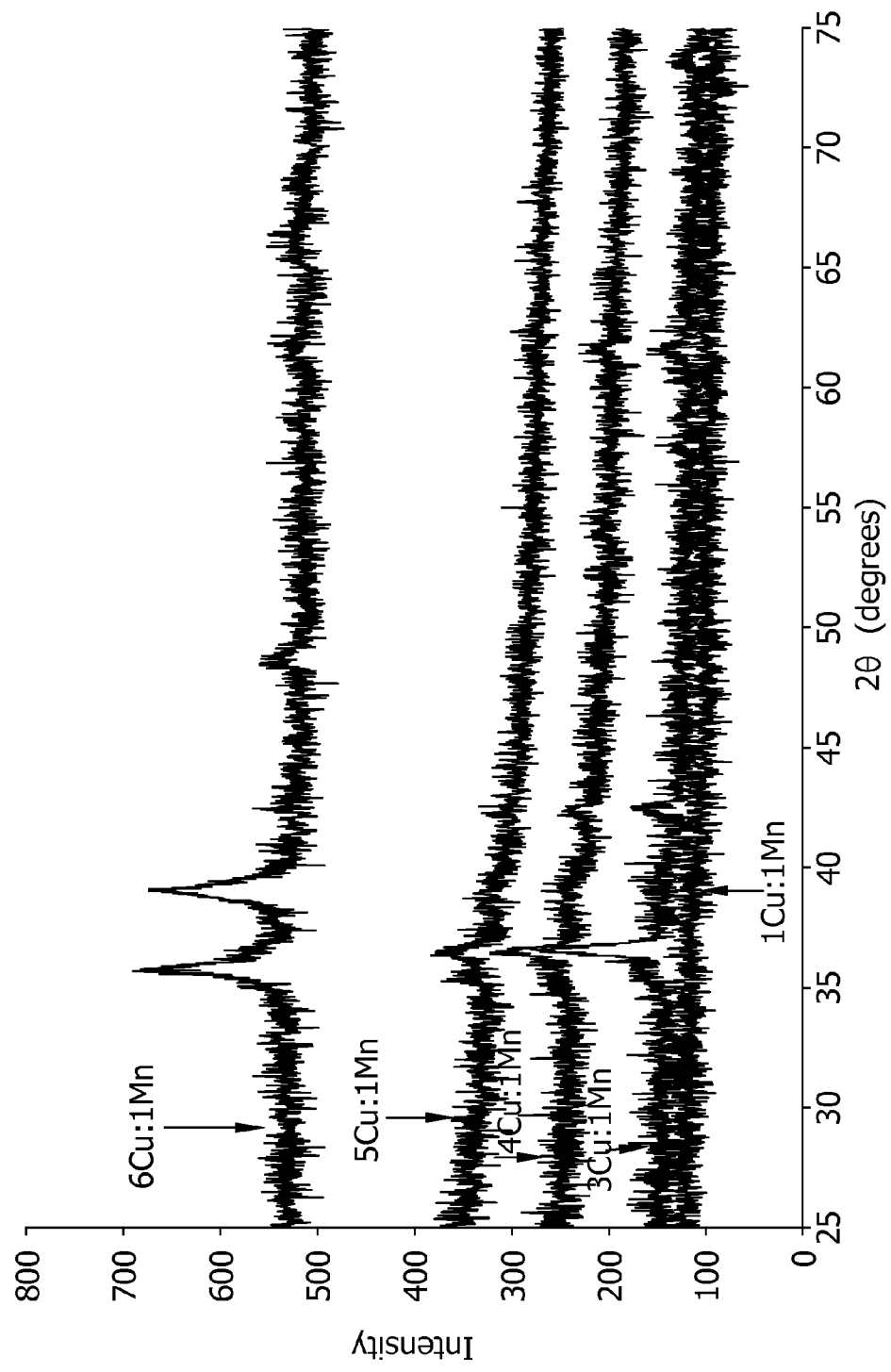
FIG. 11 illustrates an x-ray diffraction graph for cathode materials formed in accordance with various embodiments of the present disclosure, and in particular illustrating the change as a function of Cu:Mn molar ratio.

Density measurements for $Cu_aMn_bO_c$ are shown in FIG. 10. The density of exemplary copper manganese oxide material was found to be between about 4.2 to about 5.5 g/cm$^3$. X-ray patterns of 250° C. heat-treated materials of Examples 7, 8, 9 and 10 are illustrated in FIG. 11. As can be seen, there are essentially no sharp peaks characteristic of crystalline materials. However, two small peaks attributable to CuO were observed for the sample prepared using Example 8. The XRD patterns of samples prepared by Examples 8, 9, and 10 exhibited a small peak, tentatively attributable to $Cu_2O$. The semi-crystalline nature of the materials of the present disclosure typically occurs with higher copper content (e.g., 6:1 molar ratio of Cu:Mn). When a low copper content is used (e.g., 1:1 Cu:Mn molar ratio), the resulting material is essentially amorphous, as revealed by XRD.

The surface area of this material was measured by BET method and found to be about 70 m$^2$/g. Scanning Electron Microscopic images in FIG. 12A illustrate the particles are in micron size; however, the higher magnification image (insert in FIG. 12A) reveals the nano sized particles are agglomerated and form micron size particles. The agglomerated particles produce a more "pore-like" structure with a high surface area. FIG. 12B illustrates a SEM image showing two different features of the surfaces, which are likely to originate from two different components. One component is highly electrically conductive, which is CuO, is darker (arrow indicated in FIG. 12B) and the low conductive component is likely an amorphous form of manganese oxide and/or copper manganese oxides, which are brighter in the illustrated image due to their less conductive nature.

Figure 13A:
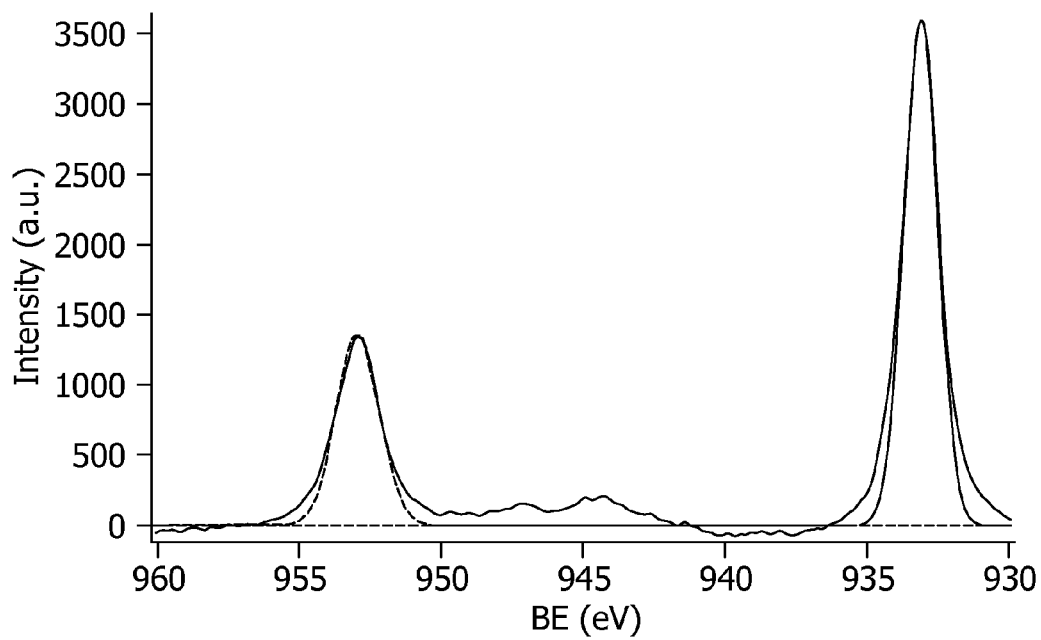
FIGS. 13A (XPS-Cu) and 13B (XPS-Mn) illustrate x-ray photon spectroscopic results of cathode materials formed in accordance with various embodiments of the present disclosure.
Figure 13B:
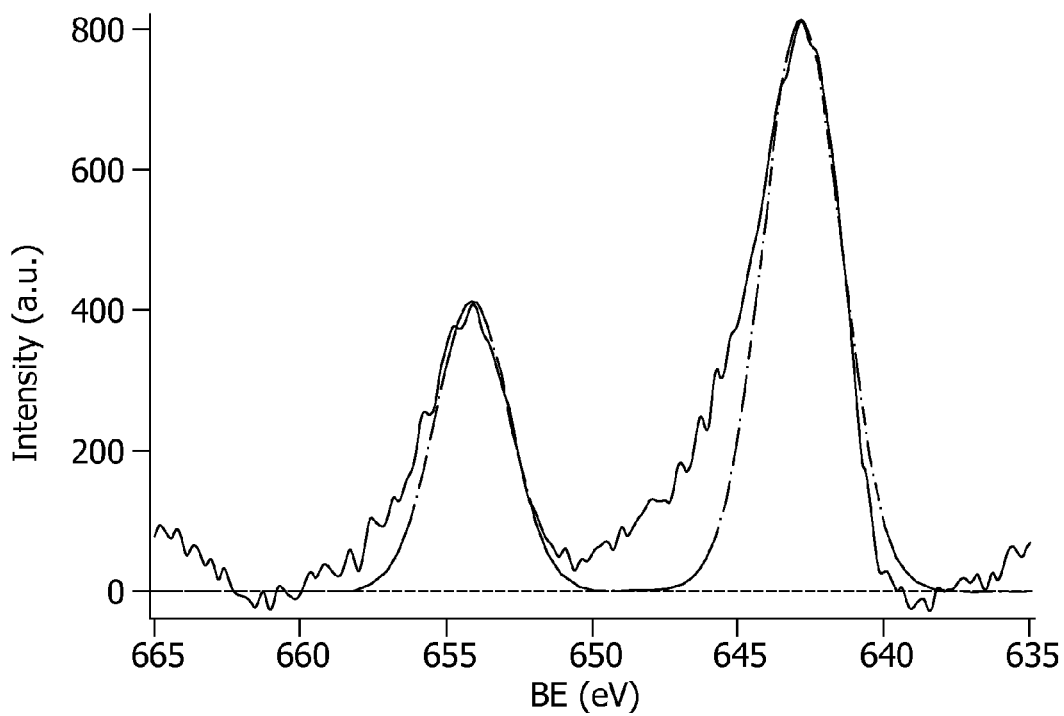

FIGS. 13A and 13B illustrates the X-ray Photon Spectroscopy (XPS) results of a sample formed in accordance with Example 7. The detailed peak analysis of Cu shows two peaks at 934.1 eV and 954.0 eV, attributable to the characteristic binding energy of CuO and $Cu_aMn_bO_c$, respectively. Further, the analysis of manganese element shows binding energy peaks at 642.8 and 654.1 eV, belonging to manganese (IV) oxide (MnO2). The large shoulder in the Mn peak may be due to part of the materials being in a high oxidation state. The calculated metal to oxygen ratio is 0.44, for example; it is well known that metal to oxygen ratio of $Cu_aMn_bO_c$ spinel is 0.6 and CuO/MnO$_2$ is 0.5. These results suggest that this compound is likely in higher oxidation state than spinel form of $Cu_aMn_bO_c$.

In the illustrated cases, the XRD results show that CuO is a semi- and/or crystalline material, whereas manganese oxide and copper manganese oxide are amorphous. XPS and elemental analysis confirms the composition of the materials, which contains Cu, Mn and O. The detailed elemental scan by XPS further indicates the presence of CuO, MnO$_2$ and $Cu_aMn_bO_c$. High magnification SEM images show the presence of different elements in the sample. These results suggest that the material of the present disclosure exhibits an amorphous and/or a semi-crystalline nature.

Figure 14:
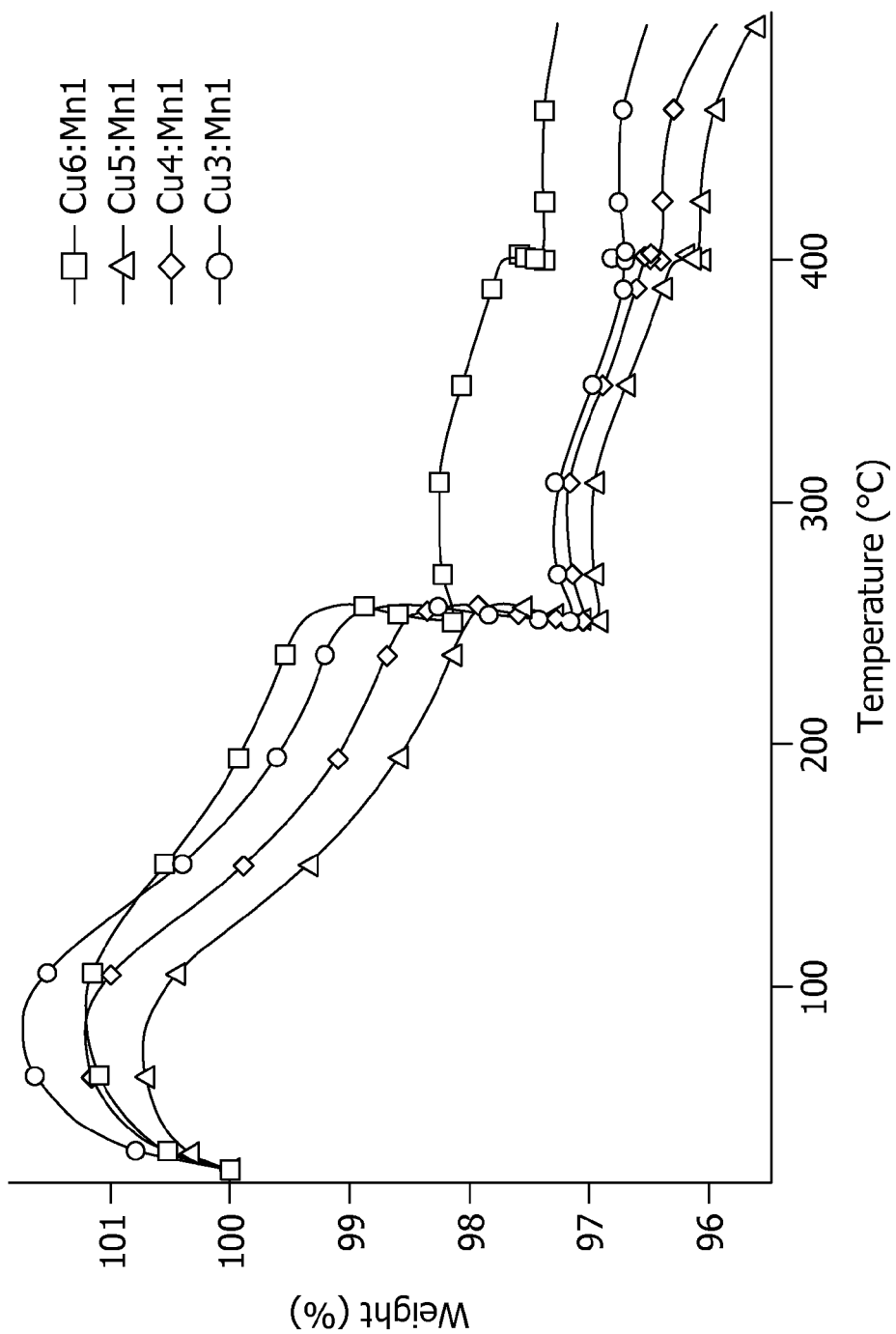
FIG. 14 illustrates thermal decomposition of cathode materials formed in accordance with various embodiments of the present disclosure, and in particular the change as a function of Cu:Mn molar ratio.

FIG. 14 shows the thermal decomposition of copper manganese oxides synthesized using different molar ratios. The thermal decomposition was performed in air at the heating rate of 10° C./min. FIG. 14 shows that all these materials are thermally stable at 500° C., and the observed weight loss was about 4%, which can be attributed to surface or crystalline water. When stored, the cathode (made up of the cathode material of the present disclosure) in electrolyte (PC/DME/LiBF$_4$) at 60° C. for 22 days, the average dissolved amount of Cu and Mn is about 5 ppm and 1 ppm, respectively. This data demonstrates good chemical and thermal stability of the materials of various embodiments of the present disclosure.

Electrochemical behavior of the cathode material in accordance with various embodiments of this disclosure was evaluated in 2325 size coin cell using lithium metal as an anode. The cathode consisted of 70% $Cu_aMn_bO_c$ as the active material, 27% KS4 graphite as conductive fillers, and 3% PTFE as binder. $Cu_aMn_bO_c$ and KS4 were first mixed using a mortar and pestle. Then PTFE powder was added to the resulting mix while mixing to form a cathode sheet. The electrode was cut from the resulting sheet with a die. Prior to testing in 2325 size coin cells, the cathodes were vacuum dried at 120° C. for about 4 hours.

Figure 15:
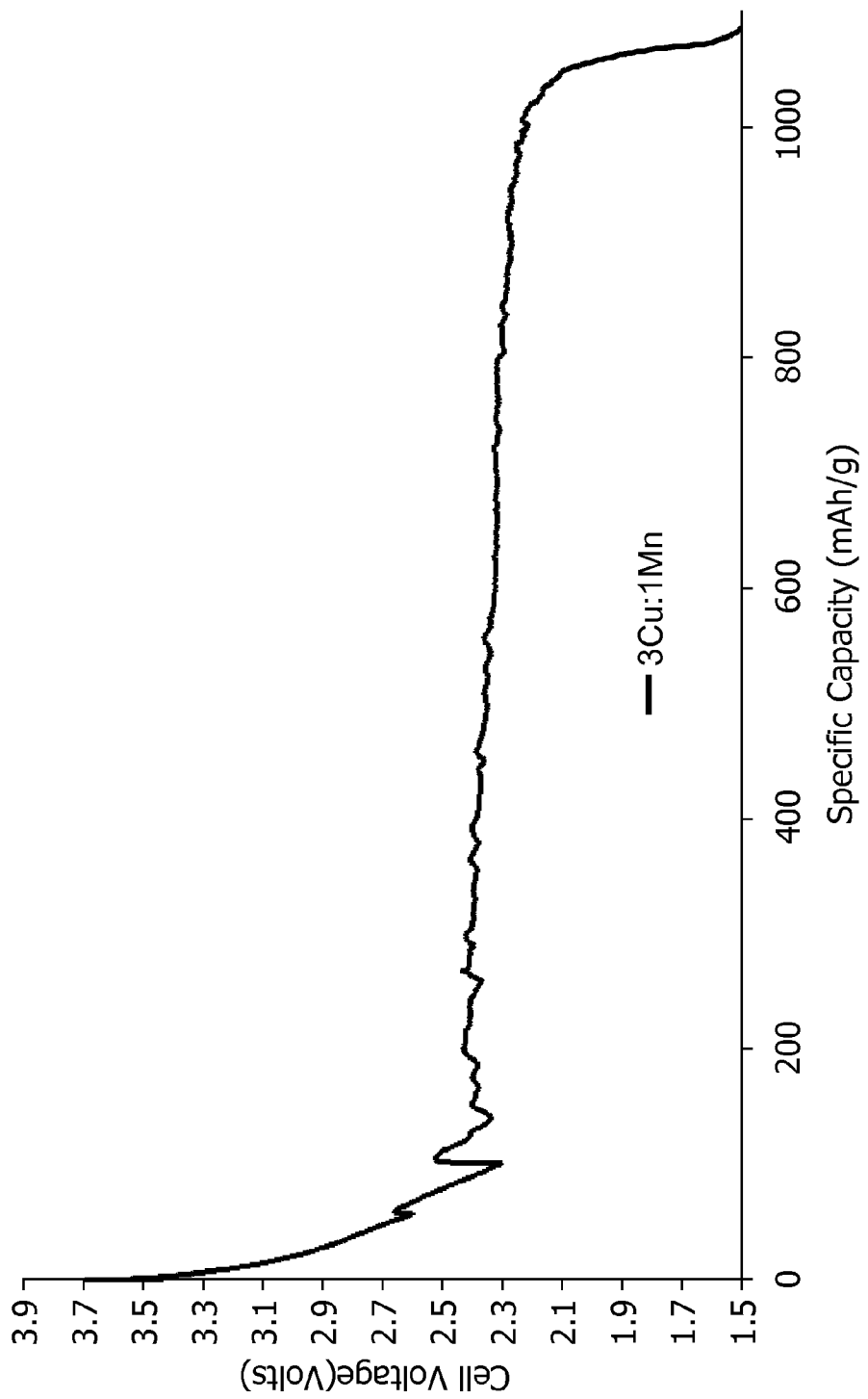
FIG. 15 illustrates a discharge voltage profile of a cell formed according to a further embodiment of the present disclosure (the Cu:Mn molar ratio of the cathode material therein being 3:1).

FIG. 15 shows the discharge profile of the cathode materials of Example 10 in a coin cell using lithium metal as an anode. The electrochemical performance was measured using a Maccor battery testing system. The first discharge of the cell was at 10 mA/g, down to 2.6 Volts, the second at 5 mA/g down to 2.3 Volts, and the third 1 mA/g down to 1.5 Volts (signature test). Thus, $Cu_aMn_bO_c$, according to various embodiments, exhibited a specific capacity of about 900 mAh/g to about 2 Volts, with a plateau to about 2.4 Volts.

Figure 16:
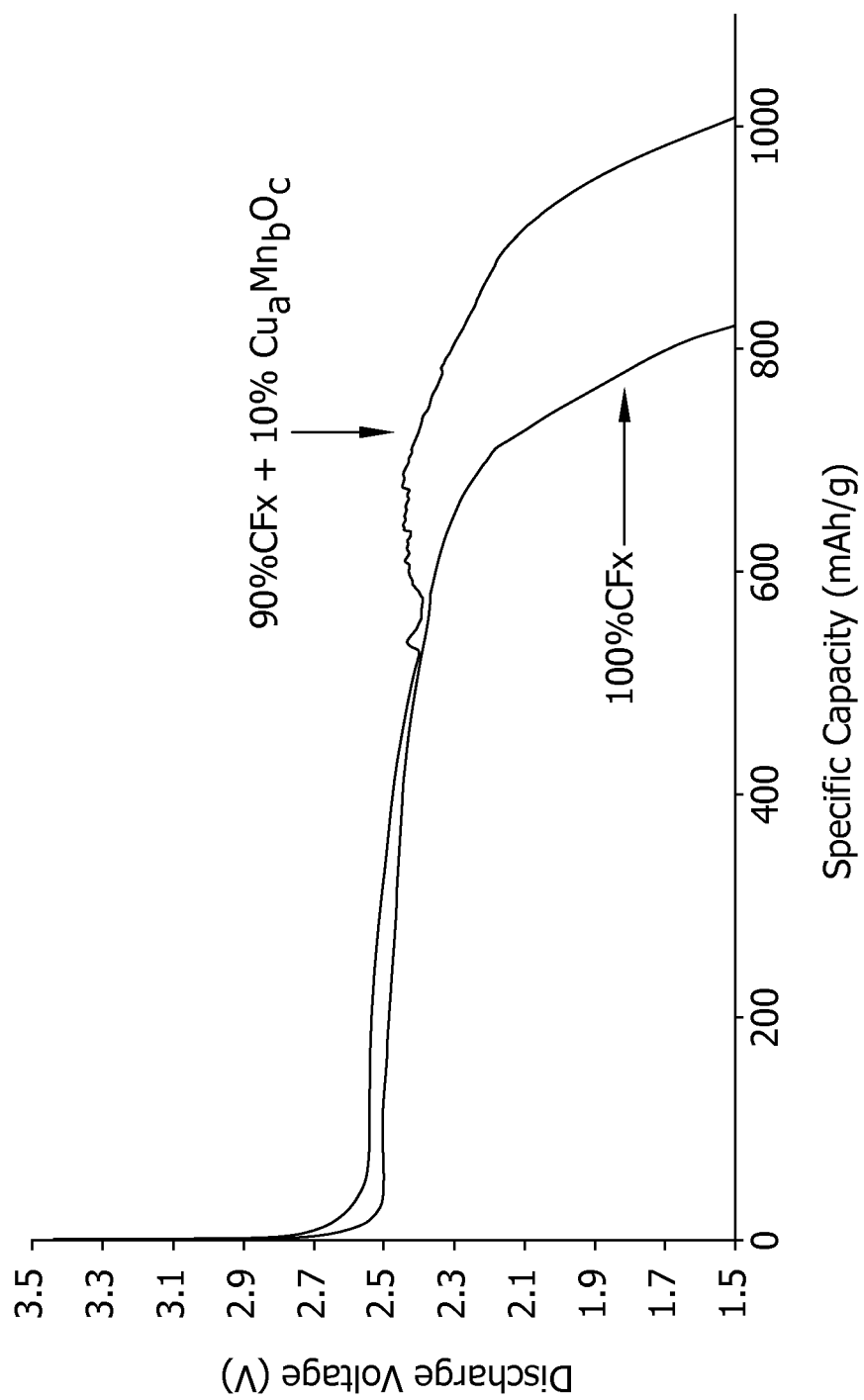
FIG. 16 illustrates a discharge voltage profile of a cell formed according to yet another embodiment of the present disclosure.

In a further embodiment, $Cu_aMn_bO_c$, was mixed with carbon fluoride (CF$_1$/CF$_{0.6}$ in the ratio of about 80/20) to form a cathode. The cathode active part of the blend, which included about 90% (by weight) carbon fluoride and 10% (by weight) $Cu_aMn_bO_c$, was mixed with carbon black and graphite. (All percents set forth herein are in weight percents, unless otherwise noted.) The investigated cathode was prepared as described herein above. The discharge profile of the cell built with the resulting cathode, at a discharge rate of 10 mA/g, is illustrated in FIG. 16. Discharge data for cells built with carbon fluoride alone as active are provided in FIG. 16 for comparison. The specific capacity to 1.5 Volts of cells built with the admixture of carbon fluoride and $Cu_aMn_bO_c$, in accordance with the present disclosure, as cathode materials is about 1007 mAh/g. When evaluated alone, carbon fluoride based cells delivered a specific capacity to 1.5 Volts of about 820 mAh/g.

It is to be noted that the mixture of 90% CF$_x$, having an expected capacity of about 746 mAh/g, and 10% $Cu_aMn_bO_c$, having an expected capacity of about 1000 mAh/g, would be expected to produce a hybrid cathode delivering a capacity of about 846 mAh/g. However, the new cathode produced an unexpected value of about 19% greater capacity at about 1007 mAh/g. Thus, the incorporation of the $Cu_aMn_bO_c$ into carbon fluoride, according to various embodiments of the present disclosure, thus led to cells with about 35% capacity improvement as compared to cells built with carbon fluoride alone as cathode active materials.

Example 18

Internally Rechargeable Battery

Figure 17:
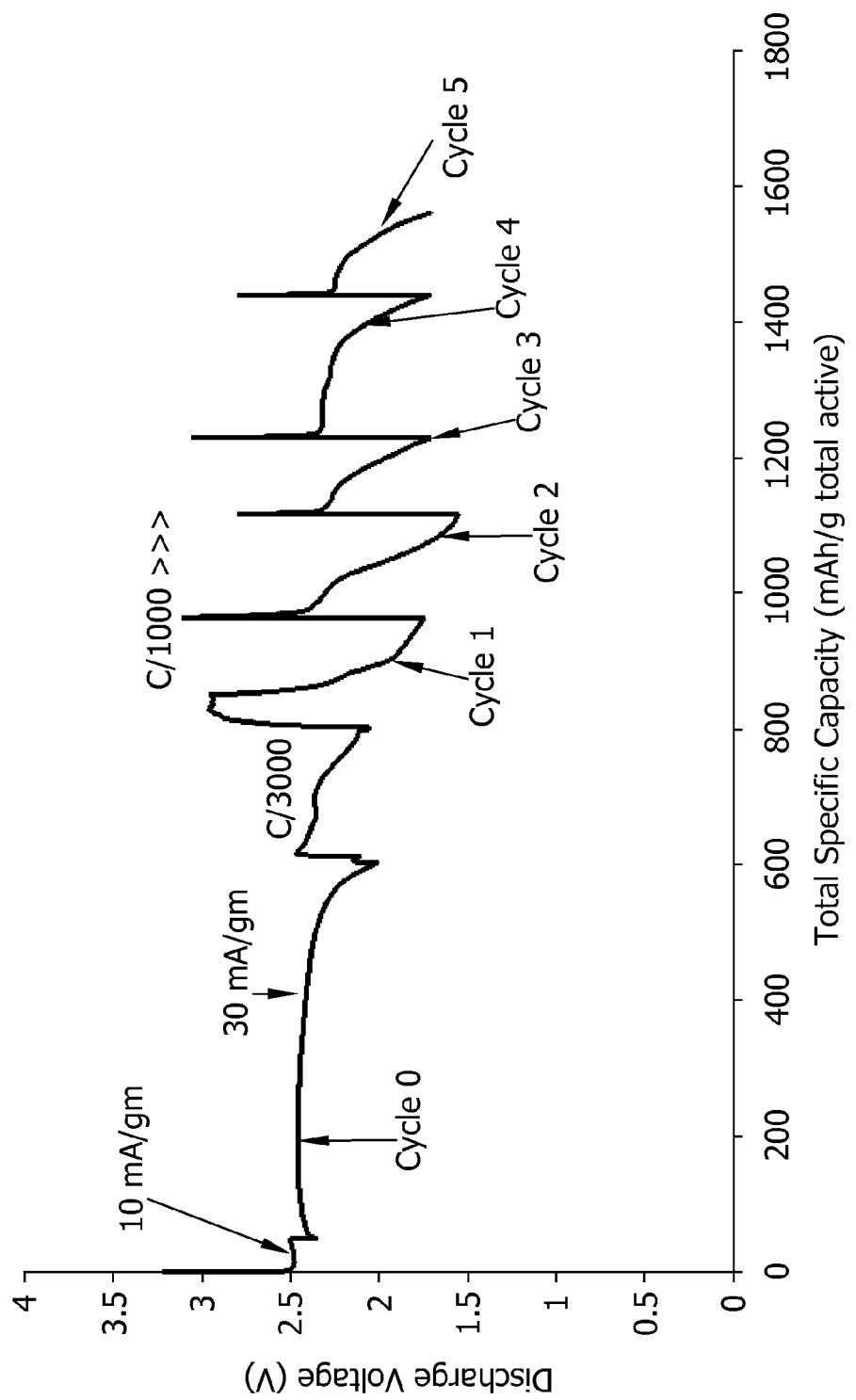
FIG. 17 illustrates a discharge profile of a cell formed according to yet another embodiment of the present disclosure.

As previously noted, cells comprising CF$_x$ and the copper manganese mixed oxide of the present disclosure have been observed to exhibit a self-charging capability (i.e., an internal charging or recharging capability). Without being held to any particular theory, it is believed that this is due at least in part to redox reactions involving the discharge products within the cathode as previously discussed above. FIG. 17 shows the discharge behavior at 3 mA/g of the cell after 5 cycles of self-charging. Note that the cell was first discharged using a signature test (i.e., 10 mA/g to 2.5 Volts, 30 mA/g to 2.0 Volts and then at 1 mA/g). It was then taken out of testing and allowed to rest for about 5 days prior to discharging. While resting, the cell OCV rose from about 1.7 Volts to about 2.9 Volts, which suggests an internal- or self-charging process.

Figure 18:
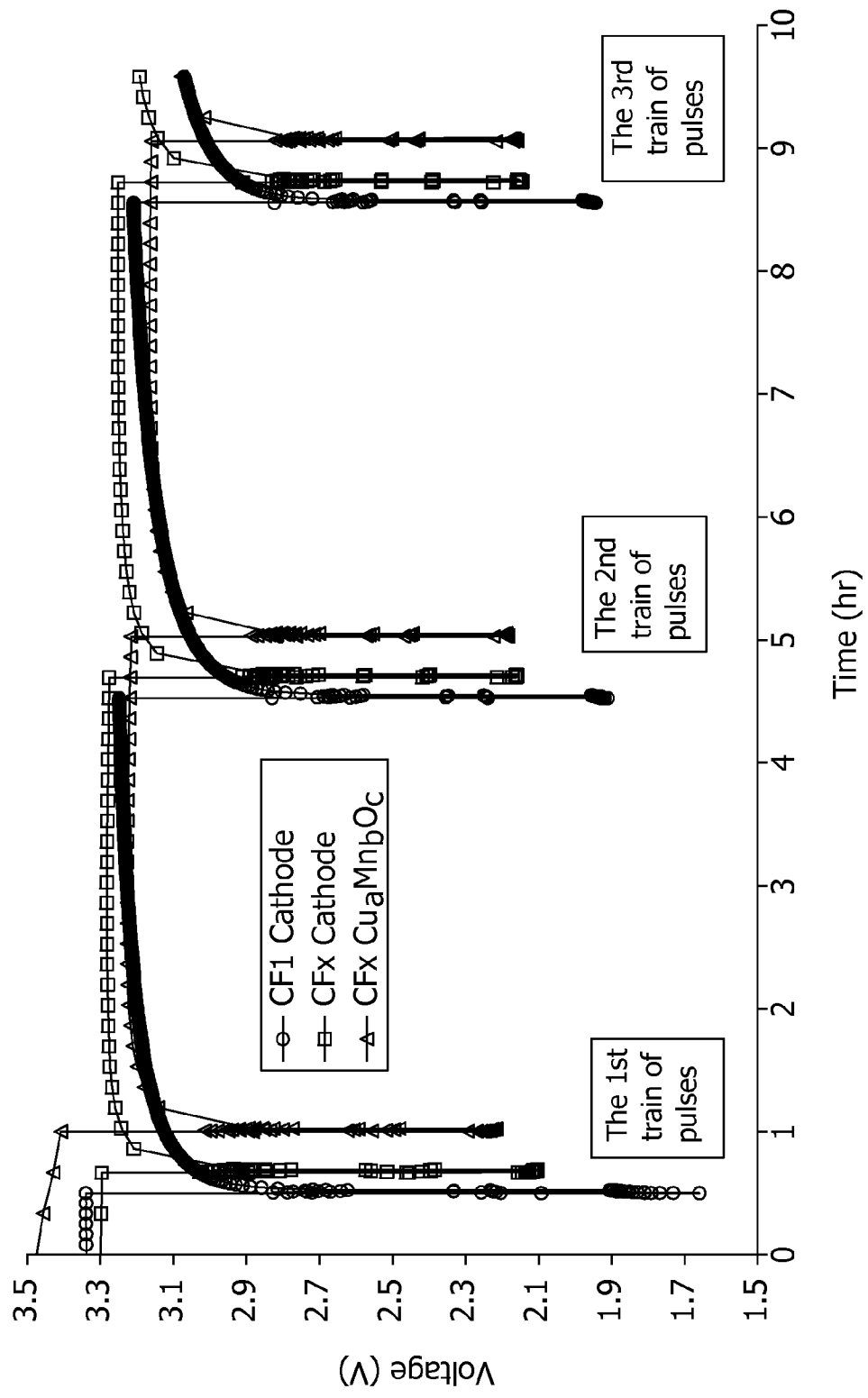
FIG. 18 illustrates voltage profiles for ICD testing on $LiCF_1$, $Li/CF_x$, and $Li/(CF_x+Cu_aMn_bO_c)$ cells in accordance with various embodiments of the present disclosure.

FIG. 18 illustrates the voltage profile on ICD test of a pouch cell comprising $CF_x$ and the cathode materials of the present disclosure, $Cu_aMn_bO_c$. The cathode comprised about 90% $CF_x$ and about 10% $Cu_aMn_bO_c$, by weight. The discharge protocol was as follows: there were four pulses per train in every four hours. The pulse amplitude was calculated by 0.7 A per gram of active materials. As shown in FIG. 18, the voltage dip for the first train of pulses was lessened or eliminated by incorporating the $Cu_aMn_bO_c$ material of the present disclosure into the cathode. This result suggests that the cell comprising $CF_x$ and the cathode of the present disclosure has a good rate capability at early stage of discharge compared to cell comprising $CF_x$ without $Cu_aMn_bO_c$.

When introducing elements of the present disclosure or the preferred embodiments(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above-described embodiments (e.g., cathode material compositions, electrochemical cell components and configurations, etc.) without departing from the scope of the disclosure, it is intended that all matter contained in the above description and shown in the accompanying figures shall be interpreted as illustrative and not in a limiting sense.

What is claimed is:

1. A system for selectively providing an indication of an end of life condition comprising:
  an electrochemical device comprising a positive terminal, a negative terminal, and a cell comprising a cathode, the cathode comprising an amorphous or semi-crystalline copper manganese oxide cathode material;
  a sense component comprising a voltage sensor for sensing a voltage of the electrochemical device, said sense component having a positive input, a negative input, and an output, wherein the positive input is connected to the positive terminal of the electrochemical device and the negative input is connected to the negative terminal of the electrochemical device; and
  a controller connected to the output of the sense component, the controller receiving a signal from the sense component indicative of the voltage of the electrochemical device, determining whether to provide an indication of an end of life condition as a function of the received signal, and selectively providing an indication of the end of life condition as a function of said determining,
  wherein an average molar ratio of copper to manganese in the copper manganese oxide cathode material is from about about 3:1 to 6:1.

2. The system of claim 1, wherein:
  the electrochemical device is one of a battery and a capacitor, the electrochemical device comprising a plurality of electrochemical cells substantially identical to the cell, and
  the controller selectively provides the indication of the end of life condition by alerting a user to that the end of life condition has been determined.

3. The system of claim 1, wherein:
  the cathode comprises copper manganese oxide in combination with fluorinated carbon,
  the combination of copper manganese oxide and fluorinated carbon has a greater discharge voltage at higher specific discharge capacities than fluorinated carbon, and
  the cathode further comprises a binder material and a conductive additive.

4. The system of claim 1, wherein:
  the cell further comprises:
    an anode comprising a metal selected from the group consisting of Group 1A and Group 2A of the Periodic Table of the Elements;
    a separator disposed between the anode and the cathode comprising a polymer membrane; and
    a non-aqueous, ionically conductive electrolyte, wherein said electrolyte comprises an ionizable alkali metal salt dissolved in an aprotic organic solvent or a mixture of solvents comprising a relatively low viscosity solvent and a relatively high permittivity solvent, and
  said electrolyte is in fluid communication with the anode, the cathode, and the separator.

5. The system of claim 1, wherein:
  the electrochemical device has a first plateau at a first discharge voltage and a second plateau at a second discharge voltage less than the first discharge voltage, and
  the controller determines that a first indication of the end of life condition should be provided when the received signal is indicative of the voltage of the electrochemical device having decreased below a first threshold voltage, and
  the first threshold voltage is between the first discharge voltage and the second discharge voltage.

6. The system of claim 1, wherein:
  the electrochemical device has a first plateau at a first discharge voltage and a second plateau at a second discharge voltage less than the first discharge voltage, and
  the controller determines that a second indication of the end of life condition should be provided when the received signal is indicative of the voltage of the electrochemical device having decreased below a second threshold voltage, and
  the second threshold voltage is less than the second discharge voltage.

7. The system of claim 1, wherein:
  the sense component further comprises a temperature sensor for measuring the temperature of the electrochemical device, and
  the controller determines whether to provide the indication of the end of life condition as a function of the temperature of the electrochemical device.

8. The system of claim 1, wherein:
  the sense component further comprises a current monitor for measuring a current provided by the electrochemical device, and
  the controller determines whether to provide the indication of the end of life condition as a function of the current provided by the electrochemical device.

9. The system of claim 1, wherein:
  the controller is operable in a reduced energy use state;
  the controller further comprises a sleep timer for waking the controller from the reduced energy use state at a predetermined time; and
  the controller determines, in response to said waking, whether to provide the indication of the end of life condition.

10. The system of claim 1, wherein:
the controller is operable in a reduced energy use state;
the controller is responsive to a command from an external interrupter for waking from the reduced energy use state and determining whether to provide the end of life indication; and
the external interrupter is other than in direct physical contact with the system.

11. The system of claim 1, wherein the controller further comprises a transmit component for providing the indication of the end of life condition by transmitting a signal indicative of the end of life condition to a receiver.

12. An electronic device comprising:
a load having a positive terminal and a negative terminal;
an electrochemical device comprising a positive terminal, a negative terminal, and a cell comprising a cathode, the cathode comprising an amorphous or semi-crystalline copper manganese oxide cathode material, wherein the positive terminal of the electrochemical device is connected to the positive terminal of the load, the negative terminal of the electrochemical device is connected to the negative terminal of the load, and the electrochemical device provides electrical power to the load; and
an end of life sensor comprising:
a sense component comprising a voltage sensor for sensing a voltage of the electrochemical device, said sense component having a positive input, a negative input, and an output, wherein the positive input is connected to the positive terminal of the electrochemical device and the negative input is connected to the negative terminal of the electrochemical device; and
a controller connected to the output of the sense component, the controller receiving a signal from the sense component indicative of the voltage of the electrochemical device, determining whether to provide an indication of an end of life condition as a function of the received signal, and selectively providing an indication of the end of life condition as a function of said determining,
wherein an average molar ratio of copper to manganese in the copper manganese oxide cathode material is from about about 3:1 to 6:1.

13. The electronic device of claim 12, wherein the cathode comprises copper manganese oxide in combination with fluorinated carbon,
the combination of copper manganese oxide and fluorinated carbon has a greater discharge voltage at higher specific discharge capacities than fluorinated carbon, and
the cathode further comprises a binder material and a conductive additive.

14. The electronic device of claim 12, wherein the cell further comprises:
an anode comprising a metal selected from the group consisting of Group 1A and Group 2A of the Periodic Table of the Elements;
a separator material disposed between the anode and the cathode, the separator material comprising a polymer membrane; and
a non-aqueous, ionically conductive electrolyte, wherein said electrolyte comprises an ionizable alkali metal salt dissolved in an aprotic organic solvent or a mixture of solvents comprising a relatively low viscosity solvent and a relatively high permittivity solvent, said electrolyte being in fluid communication with the anode, the cathode, and the separator.

15. The electronic device of claim 12, wherein:
the electrochemical device has a first plateau at a first discharge voltage and a second plateau at a second discharge voltage less than the first discharge voltage,
the controller determines that a first indication of the end of life condition should be provided when the received signal is indicative of the voltage of the electrochemical device having decreased below a first threshold voltage, and
the first threshold voltage is between the first discharge voltage and the second discharge voltage.

16. The electronic device of claim 12, wherein:
the electrochemical device has a first plateau at a first discharge voltage and a second plateau at a second discharge voltage less than the first discharge voltage,
the controller determines that a second indication of the end of life condition should be provided when the received signal is indicative of the voltage of the electrochemical device having decreased below a second threshold voltage, and
the second threshold voltage is less than the second discharge voltage.

17. A method of selectively providing an indication of an end of life condition in a cell having a cathode comprising an amorphous or semi-crystalline copper manganese oxide cathode material, said method comprising:
connecting an electrochemical device comprising the cell to an end of life sensor, wherein the electrochemical device further comprises a positive terminal and a negative terminal, the end of life sensor comprises a positive input and a negative input, and wherein the positive terminal of the electrochemical device is connected to the positive input of the end of life sensor, and the negative terminal of the electrochemical device is connected to the negative input of the end of life sensor;
sensing a discharge voltage of the electrochemical device via a sense component of the end of life sensor, said sense component comprising a voltage sensor for sensing the discharge voltage of the electrochemical device and providing a signal indicative of the sensed discharge voltage to a controller of the end of life sensor via an output of the sense component;
determining whether to provide an indication of an end of life condition, said determining being at least in part a function of the signal provided by the voltage sensor to the controller; and
selectively providing an indication of the end of life condition as a function of said determining,
wherein an average molar ratio of copper to manganese in the copper manganese oxide cathode material is from about 3:1 to 6:1.

18. The method of claim 17, wherein:
the electrochemical device has a first plateau at a first discharge voltage and a second plateau at a second discharge voltage less than the first discharge voltage,
the controller determines that a first indication of the end of life condition should be provided when the provided signal is indicative of the voltage of the electrochemical device having decreased below a first threshold voltage, and
the first threshold voltage is between the first discharge voltage and the second discharge voltage.

19. The method of claim 17, wherein:
the electrochemical device has a first plateau at a first discharge voltage and a second plateau at a second discharge voltage less than the first discharge voltage,
the controller determines that a second indication of the end of life condition should be provided when the provided signal is indicative of the voltage of the electrochemical device having decreased below a second threshold voltage, and the second threshold voltage is less than the second discharge voltage.

20. The method of claim 17, further comprising:

operating the end of life sensor in a reduced energy use state; and waking the end of life sensor at a predetermined time, wherein in response to said waking, the controller determines whether to provide the indication of the end of life condition.

21. The method of claim 17, further comprising:

operating the end of life sensor in a reduced energy use state; and waking the end of life sensor in response to a command from an external interrupter, wherein:

said external interrupter is not in direct physical contact with the end of life sensor at a predetermined time; and in response to said waking, the controller determines whether to provide the indication of the end of life condition.

22. The method of claim 17, wherein providing the indication of the end of life condition comprises transmitting a signal to a receiver via a transmitter of the end of life sensor.

* * * * *